United States Patent [19]
Komorita et al.

[11] Patent Number: 5,328,751
[45] Date of Patent: Jul. 12, 1994

[54] CERAMIC CIRCUIT BOARD WITH A CURVED LEAD TERMINAL

[75] Inventors: Hiroshi Komorita; Nobuyuki Mizunoya, both of Yokohama; Kazuo Matsumura, Kawasaki; Kazuo Ikeda, Yokohama; Takayuki Naba, Kawasaki; Tadashi Tanaka, Matsudo, all of Japan

[73] Assignee: Kabushiki Kaisha Toshiba, Kawasaki, Japan

[21] Appl. No.: 911,713

[22] Filed: Jul. 10, 1992

[30] Foreign Application Priority Data

| Jul. 12, 1991 | [JP] | Japan | 3-172814 |
| Nov. 11, 1991 | [JP] | Japan | 3-294568 |
| Nov. 26, 1991 | [JP] | Japan | 3-310979 |
| Jun. 22, 1992 | [JP] | Japan | 4-162677 |

[51] Int. Cl.$^5$ .............................. B32B 9/00
[52] U.S. Cl. ........................ 428/209; 428/901; 428/688; 428/210; 361/772
[58] Field of Search ........... 428/209, 901, 210, 688, 428/689; 439/876, 288; 420/557; 361/748, 760, 772, 777

[56] References Cited

U.S. PATENT DOCUMENTS

| 4,497,875 | 2/1985 | Arakawa et al. | 428/620 |
| 4,704,320 | 11/1987 | Mizunoya et al. | 428/901 |
| 4,910,643 | 3/1990 | Williams | 361/414 |
| 4,939,022 | 7/1990 | Palanisamy | 428/901 |
| 4,954,386 | 9/1990 | Mizunoya et al. | 428/209 |
| 5,019,187 | 5/1991 | Iyogi | 420/557 |

FOREIGN PATENT DOCUMENTS

| 0211619 | 2/1987 | European Pat. Off. |
| 61-176142 | 8/1986 | Japan |

OTHER PUBLICATIONS

Coombs, "Printed Circuit Handbook," McGraw Hill 1988, pp. 3.1-3.26, 29.14.
Patent Abstracts of Japan, vol. 15, No. 367(E-1112)(4895), Sep. 17, 1991, & JP-03-145-748, Kazuya Matsuura, et al., "Ceramic Circuit Board".
Patent Abstracts of Japan, vol. 10, No. 8(E-373)(2065), Jan. 14, 1986, & JP-60-171-763, Tetsuo Morita, "Connection Structure of Ceramic Circuit Board and Lead Terminal".
Patent Abstracts of Japan, vol. 13, No. 592(c-671)(3940), Dec. 26, 1989, & JP-1-249-669, Yutaka Komorida, et al., "Ceramic Circuit Board".
Patent Abstracts of Japan, vol. 15, No. 152(E-1057) (4680), Apr. 17, 1991, & JP-3-027-590, Kunimitsu Yoshikawa, "Ceramic Circuit Board".
Patent Abstracts of Japan, vol. 16, No. 108(E-1179) (5151), Mar. 17, 1992, & JP-3-283-554, Yuji Yokomizo, "Hybrid Integrated Circuit".
Patent Abstracts of Japan, vol. 15, No. 334(E-1104) (4862), Aug. 26, 1991, & JP-3-126-287, Yutaka Komorida, et al., "Printed Circuit Board".

*Primary Examiner*—Patrick J. Ryan
*Assistant Examiner*—Patrick Jewik
*Attorney, Agent, or Firm*—Oblon, Spivak, McClelland, Maier & Neustadt

[57] ABSTRACT

This invention provides a ceramic circuit board comprising: a ceramic base board; a metal circuit plate integrally bonded onto a surface of the ceramic base board; a terminal connecting port formed by bending a part of the metal circuit plate for connecting a terminal of a module, the terminal connecting port being formed so that the terminal connecting port is raised from a surface of the ceramic base board, and a curvature radius of the bent portion provided on the terminal connecting port is set to 0.2 mm or more. An empty communication hole such as groove or through hole may also be formed at a bonding surface between the metal circuit plate and the ceramic base board.

11 Claims, 15 Drawing Sheets

CERAMIC CIRCUIT BOARD WITH A CURVED LEAD TERMINAL

TECHNICAL BACKGROUND OF THE INVENTION

The present invention relates to a ceramic circuit board, more particularly to a ceramic circuit board which enables the reduction of an influence of stress caused by heat cycles during the operation of the circuit board, to increase the durability and reliability of the ceramic circuit board.

In recent years, various types of ceramic circuit boards have been widely used as a circuit board for a hi-power transistor module or a high-speed, high-power switching power source modules. The ceramic circuit board comprises a ceramic base board composed of ceramic sintered body and a metal plate such as a copper plate integrally bonded onto a surface of the ceramic base board, the metal plate having high-thermal conductivity and high-electrical conductivity.

Further, as a material for the ceramic base board, aluminum nitride, silicon nitride, silicon carbonate or the like are now widely used because of their excellent electrical insulation and thermal conductivity.

The ceramic circuit board having a circuit composed of the conductive metal plate such as copper plate is generally manufactured in accordance with a DBC method (Direct Bonding Copper method) wherein the metal plates are directly bonded onto the ceramic base board, or an active metal brazing method wherein the metal plates are bonded onto the surface of the ceramic base board through a brazing material containing an active metal, such as 4A family elements and/or 5A family elements (hereinafter referred to as "active metal") listed in the periodic table. Namely, the active metal is selected from the group consisting of Ti, Zr, Hf, V, Nb and Ta. The brazing material containing such an active metal activates the surface of the ceramic base board. In other words, the brazing material imparts wettability to the bonding surface of the ceramic base board, to thereby realize a high-bonding strength.

As a concrete method of forming the circuit, the following methods are known: i.e., the methods may include one wherein a metal plate having a predetermined circuit pattern previously formed by press working or etching treatment are bonded onto the ceramic base board; or a method wherein the circuit patterns are formed after a raw material of the metal plate is bonded onto the ceramic base board.

FIG. 27 shows a construction of the ceramic circuit board manufactured in accordance with the DBC method described above. The ceramic circuit board is manufactured by the following processes. That is, a raw copper material is punched out to form a plurality of copper circuit plates 2A, 2B and 2C each having a predetermined shape (circuit pattern). The copper circuit plates 2A, 2B and 2C are, then, arranged and contacted to both surface sides of the ceramic base board 1 composed of alumina ($Al_2O_3$) or an aluminum nitride (AlN) sintered body or the like having a thickness of about 0.3 to 3 mm, to thereby form a board assembly. Then, the board assembly is heated up to a predetermined temperature to generate an eutectic liquid phase to thereby impart wettability to the surface of the ceramic base board 1. Subsequently, the board assembly is cooled and the eutectic liquid phase is solidified whereby the copper circuit plates 2A, 2B and 2C are directly bonded onto the ceramic base board 1.

Further, among the plurality of the copper circuit plates 2A, 2B and 2C, an edge portion of the copper circuit plate 2A is provided with a terminal connecting port 3 to which a terminal of a LSI circuit element or module to be loaded onto the ceramic base board 1 is connected.

As shown in FIG. 28, the terminal connecting port 3 is previously formed by punching out the copper circuit plate 2A by means of a press-punching machine and subsequently, bending the edge portion so as to have a U shaped section. After the copper circuit plate 2A is integrally bonded onto the surface of the ceramic base board 1 by employing the DBC method, a free edge side of the terminal connecting port 3 is retained so as to be raised from the surface of the ceramic base board 1. A terminal 4 of a module (not shown) is connected onto an upper surface of the terminal connecting port 3 through a solder 5.

In order to improve the solder wettability with respect to terminal connecting port 3 composed of copper, and to increase a bonding strength between the terminal 4 and the terminal connecting port 3, a nickel metallizing layer 6 having a thickness of about 2 to 6 μm is formed on each surface of the copper circuit plates 2, 2A to 2C.

As a result, even in a case where the terminal 4 is moved and deformed vertically due to a thermal expansion or the like as indicated by an arrow in FIG. 28, the deformation or replacement of the terminal connecting port 3 is absorbed by the bending of the terminal connecting port 3 around a base portion thereof. Accordingly, the stress caused by the thermal expansion is effectively prevented from being concentrated to the ceramic base board 1.

On the other hand, FIG. 29 shows a construction of another conventional ceramic circuit board manufactured by utilizing the active metal brazing method.

The ceramic circuit board shown in FIG. 29 comprises a ceramic base board 11 and a copper circuit plate 12 integrally bonded onto one surface of the ceramic base board 11 through a bonding layer 13 mainly composed of silver (Ag), copper (Cu) and an active metal such as titanium (Ti) or the like.

A backing copper plate 14 for preventing a thermal deformation of the ceramic base board 11 is bonded onto the other surface side of the ceramic base board 11 through a similar bonding layer 13 containing the active metal.

Further, in a module as a product, a semiconductor chip 15 such as a Si chip is bonded onto the surface of the copper circuit plate 12 through a solder layer 16, and required wires are provided so as to electrically connect the semiconductor chip 15 to the copper circuit plate 12. Also a heat sink 17 is bonded onto the back surface side of the backing copper plate 14 through a solder layer 16.

The active metal brazing method is utilized as a method of bonding a ceramic base board and a metal circuit plate to each other, the method comprising the steps of: preparing a paste by mixing a binder such as an organic component or the like and a solvent into active metal powder such as Ti or the like; pattern printing the paste onto a surface of the ceramic base board 11; arranging the copper circuit plate onto a surface of the ceramic base board 11 in along with the printed pattern to form an assembled body; and heating the assembled body in an inert gas atmosphere (i.e., Ar gas or $N_2$ gas atmosphere or the like) or vacuum to thereby thermally bond the copper circuit plate 12 onto the ceramic base board 11.

The backing copper plate 14 is also bonded onto the ceramic base board by utilizing the same method as described above.

According to the method described above, Ti reacts with nitrogen (N) or oxygen (O) to generate a TiN or TiO, at the same time, Cu and Ag react with the copper component to generate a eutectic bonding material whereby the copper circuit plate 12 and the backing copper plate 14 are firmly bonded onto the ceramic base board 11 respectively.

Any one of the ceramic circuit boards that are manufactured in accordance with the DBC method or the active metal brazing method has a simple structure, so that there can be provided advantages of enabling the miniaturization of the circuit board and the realization of high-density loading, furthermore, to simplify the mounting process, or the like.

In particular, the active metal brazing method is directly applicable to various ceramic materials, and simultaneously, has an advantage of imparting an excellent reproducibility of fine circuit pattern in comparison with that of DBC method. Therefore, the active metal brazing method will become widely used in some particular fields.

However, the conventional ceramic circuit boards shown in FIGS. 27 and 28, have a nickel plating layer formed on the copper circuit plates so as to enhance the solder wettability, so that a problem may be created in that the copper circuit plates are hardened and likely to cause breakages. In fact, the copper material is originally soft and rich in elasticity at the stage prior to being provided with the nickel plating layer. However, after forming of the nickel plating layer, the copper circuit plate will become hard due to the high-hardness of the nickel material per se. Therefore, in particular, the bent portions $P_1$ and $P_2$ of the terminal connecting port 3 become brittle, so that repeated bending strength of the bent portions $P_1$ and $P_2$ will be disadvantageously decreased.

In the conventional case described above, a radius of curvature $R_1$ and $R_2$ of the bent portions $P_1$ and $P_2$ is small, about 0.1 mm, so that bending stress is concentrated to the bent portions $P_1$ and $P_2$ to easily cause cracks which result in the terminal connecting port 3 being liable to be broken in a short period of time. This reduces the reliability of the ceramic circuit board.

More particular, in the ceramic circuit board having such a terminal connecting port, temperature variation caused by the ON/OFF switching operation of the power source is repeatedly applied onto the terminal connecting port. Accordingly, a problem may be created in that the crack or breakage is more liable to occur at the terminal connecting port.

On the other hand, in the case of the conventional ceramic circuit board manufactured by employing the active metal brazing method, the bonding layer 13 for bonding the ceramic base board 11 and the copper circuit plates or the like (i.e., the copper circuit plate 12 and the backing copper plate 14), or the bonding layer 14 for bonding the copper plates 12, 14 and the semiconductor chip or the like (i.e., the semiconductor chip 15 and the heat sink 17) do not always impart or realize a sufficient bonded state.

Namely, in the process where the ceramic base board 11 and the copper circuit plates 12 and 14 or the like are thermally bonded to each other, if a dewaxing operation is effected uncompletely, carbon (C) contained in the bonding material is not completely removed whereby residual carbon remains within the bonding layer 13.

The residual carbon C is liable to react with the active metal such as Ti, resulting in disadvantageously forming TiC which interrupts an essential reaction to be required between the Ti component and N or O contained in the ceramic base board 11. Therefore, various problems are created in that: non-bonded portions are formed in the bonding layer 13; or even in a case where the bonding is effected completely, the bonding strength thereof may be lowered. In some adverse cases, a proportion of the non-bonded area with respect to the an entire bonding surface will reach almost up to 30%.

In a module assembling process, when a high-temperature solder is placed onto the surfaces of the copper circuit plates 12, 14 and subsequently, the semiconductor chip 15 and the heat sink 17 are arranged onto the surface of the copper circuit plates 12 and 14, gases such as air and atmospheric gas are likely to be involved between the semiconductor chip 15 and the copper circuit plate 12, or between the heat sink 17 and the backing copper plate 14 whereby there may be posed a case where the gases remain in the solder layer 16.

When the gases remain in the solder layer 16, various problems may occur in that: a pore 18, so-called, a solder void may be formed as schematically shown in FIG. 29, to thereby reduce the bonding strength. Further, thermal resistance of the final product will increase to thereby deteriorate heat releasing capability. Additionally, the semiconductor chip 15 may easily be broken, thus reducing the reliability of the module or the like.

Furthermore, when the ceramic circuit board having the semiconductor chip 15 thereon, which is manufactured by employing the active metal brazing method, is assembled into a power-transistor module or the like, a terminal of the module is soldered to a part of the circuit of the copper circuit plate or the like so as to secure an electric continuity between the circuit and an electric power source.

In such a module described above, a temperature difference is necessarily caused in accordance with ON-OFF switching operations of the power source, and when the temperature difference is repeatedly applied onto the ceramic circuit board for a long period of time, as shown in FIG. 29, cracks 19 are liable to occur at a side of the ceramic base board 11. Particularly, in a case where the aluminum nitride base board is used as a ceramic base board, the mechanical strength of the aluminum nitride is lower by nature than that of other ceramic materials, so that the cracks 19 are more likely to occur.

Further, the terminal is moved and deformed in accordance with the ON-OFF switching operations of the power source, so that mechanical stresses are also applied to the ceramic circuit board. When the thermal stresses due to the temperature difference and the mechanical stresses are applied onto the ceramic circuit board for a much longer period of time, there may be posed various problems such that cleavage fractures disadvantageously occur from the portion of the cracks 19. Thus resulting in peeling-off the copper circuit plate 12 from the ceramic base board 11, and the thermal resistance of the module per se is increased, thus inducing malfunctions of the module or the like.

In order to solve the aforementioned problems inherent in the prior art, an object of the present invention is to provide a ceramic circuit board which enables the increase of the durability of the ceramic base board, and secures a sufficient bonding reliability of the metal circuit plate.

SUMMARY OF THE INVENTION

According to the first aspect of the present invention, there is provided a ceramic circuit board characterized by comprising a ceramic base board, a metal circuit plate integrally bonded onto a surface of the ceramic base board, and a terminal connecting port formed by bending a part of the metal circuit plate for connecting a terminal of a module, the terminal connecting port being formed so that the terminal connecting port is raised from a surface of the ceramic base board, and a curvature radius of the bent portion provided on the terminal connecting port is set to 0.2 mm or more.

According to the second aspect of the present invention, there is provided a ceramic circuit board characterized by comprising: a ceramic base board; a metal circuit plate integrally bonded onto a surface of the ceramic base board through a bonding layer containing an active metal selected from the group consisting of Ti, Zr, Hf, V, Nb and Ta; and a semiconductor chip bonded onto a surface of the metal circuit plate, the metal circuit plate being provided with an empty communication hole at a bonding surface between the metal circuit plate and the ceramic base board so as to communicate the bonding surface with an outside of the ceramic base board.

According to the third aspect of the present invention, there is provided a ceramic circuit board characterized by comprising: a ceramic base board; a metal circuit plate integrally bonded onto at least one surface of the ceramic base board through a bonding layer containing an active metal selected from the group consisting of Ti, Zr, Hf, V, Nb and Ta; and a step portion formed along with a peripheral edge portion of the metal circuit plate so that a thickness of the step portion is less than that of a central portion of the metal circuit plate.

According to the fourth aspect of the present invention, there is provided a ceramic circuit board characterized by comprising: a ceramic base board; a metal circuit plate integrally bonded onto a surface of the ceramic base board through a bonding layer containing an active metal selected from the group consisting of Ti, Zr, Hf, V, Nb and Ta, the metal circuit plate having a terminal connecting port for connecting a terminal of a module; and a gap partially formed between the surface of the ceramic base board and the metal circuit plate.

DETAILED DESCRIPTION OF THE INVENTION

Figure 1:
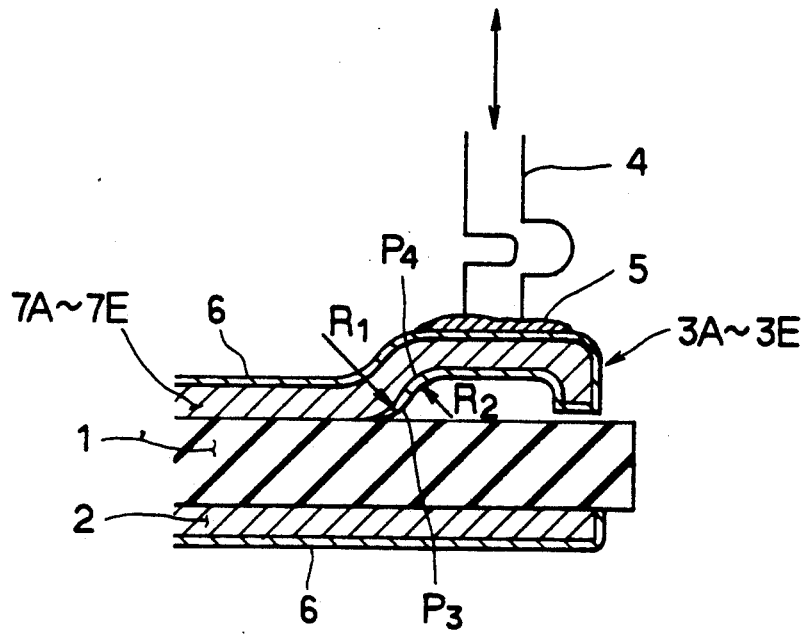
FIG. 1 is a partial sectional view showing first to fifth embodiments of a ceramic circuit board according to the present invention.

The inventors of this invention have reviewed and developed various countermeasures for enhancing the durability of the base portion of the terminal connecting port without impairing the bonding strength between the terminal and the terminal connecting port.

As a result of this research, the inventors have discovered that the radius of curvature of the bent portion formed at the edge portion of the terminal connecting port has a great influence on the durability of the bent portion. The first invention has been achieved on the basis of these findings.

Namely, according to the first aspect of the present invention, there is provided a ceramic circuit board characterized by comprising a ceramic base board, a metal circuit plate integrally bonded onto a surface of the ceramic base board, and a terminal connecting port formed by bending a part of the metal circuit plate for connecting a terminal of a module, the terminal connecting port being formed in a shape of a cantilever so that the terminal connecting port is raised from a surface of the ceramic base board. Further, a radius of curvature of the bent portion formed in the terminal connecting port is set to 0.2 mm or more.

As a method of bonding the metal circuit plate onto the ceramic circuit board, a DBC method or active metal brazing method are preferably utilized. In the DBC method, the ceramic base board and the metal circuit plate are directly bonded to each other by a eutectic phase composed of the metal and the metal oxide. On the other hand, in the active metal brazing method, the ceramic base board and the metal circuit plate are bonded to each other through a bonding layer containing an active metal selected from the group consisting of Ti, Zr, Hf, V, Nb and Ta.

The radius of curvature of the bent portion has a great influence on a degree of stress concentration with respect to the base portion of the terminal connecting port. The value of the radius of curvature is set to 0.2 mm or more in this invention. When the radius of curvature is less than 0.2 mm, the stress is liable to be concentrated at the bent portion of the terminal connecting port, so that cracks will be easily caused, thus resulting in the occurrence of breakage of the bent portion in a short period of time.

On the other hand, even though the radius of curvature is set to greater than 0.5 mm, it cannot be expected to realize a remarkable increase of the durability of the bent portion. Therefore, the radius of curvature is preferably set to a range of 0.2 to 0.5 mm. Particularly, in a case where the radius of curvature is set to 0.3 mm or greater, the same bending strength and repeated fatigue strength can be obtained that are equivalent to those of a copper circuit plate having no nickel metallizing layer.

The radius of curvature of the bent portion formed in the terminal connecting port is arbitrarily set to a predetermined value by controlling a radius of an edge portion of each of male and female pressing molds provided in a pressing machine, the radiuses thereof being previously worked and finished.

As described above, according to the ceramic circuit board of the first invention, the bent portion of the terminal connecting port is formed in a cantilever shape and the radius of curvature of the bent portion is formed greatly so as to be 0.2 mm or greater, so that the stress concentration with respect to the bent portion can be effectively prevented. Therefore, there can be provided a ceramic circuit board having high strength and less occurrence of crack or breakage in the terminal connecting port.

More particularly, even in a case where the temperature variation caused by the ON/OFF switching operation of the power source is repeatedly applied onto the terminal connecting port, it can effectively prevent the terminal connecting port from causing the crack or breakage.

In order to achieve another object, there is provided a ceramic circuit board according to the second aspect of the present invention. The ceramic circuit board comprising: a ceramic base board; a metal circuit plate integrally bonded onto a surface of the ceramic base board through a bonding layer containing an active metal selected from the group consisting of Ti, Zr, Hf, V, Nb and Ta; and a semiconductor chip bonded onto a surface of the metal circuit plate, the metal circuit plate being provided with an empty communication hole (hereinafter referred to as a "communication hole") at a bonding surface between the metal circuit plate and the ceramic base board so as to communicate the bonding surface with an outside of the ceramic base board.

According to the ceramic circuit board having such a construction described above, when a dewaxing operation is effected in a thermal bonding process wherein the ceramic base board and the copper circuit plate are thermally bonded by employing the active metal brazing method, binder gases are easily passed through the communication hole such as grooves or through holes, so that components of the binder material will be burned completely.

Therefore, the active metal would not react with C contained in the binder material but reacts with N or O contained in the ceramic base board, so that strength dispersion caused by the non-bonded portion can be effectively eliminated in a bonding layer between the ceramic base board and the copper circuit plate, thus enhancing the bonding strength to provide a ceramic circuit board having a stable performance.

In the present invention, preferred examples of material for the ceramic base board may include: non-oxide type sintered bodies such as aluminum nitride (AlN), silicon carbide (SIC), silicon nitride ($Si_3N_4$) or the like; and oxide type sintered bodies such as aluminum oxide ($Al_2O_3$), beryllium oxide (BeO) or the like.

Further, preferred examples of materials for the active metals may include Ti, Ag, Ca or the like, and the composition ratio of the active brazing material may preferably be set to 1 through 10 weight % of Ti, 10 through 50 wt. % of Ag, and 40 through 90 wt. % of Cu, respectively.

In the present invention, preferred examples of methods for forming the communication holes such as grooves or through holes onto the copper circuit plate may include: a mechanical method such as pressing by utilizing a pressing machine; a chemical working method such as an etching treatment.

If at least one of a size, arranging number and arranging density of the communication holes is so large that a proportion of a non-bonded portion will be disadvantageously increased, it becomes difficult to work the communication holes and a disadvantage of the occurrence of cracks may be caused.

On the other hand, in a case where the size, arranging number, arranging density are so small that the dewaxing operation will be effected uncompletely, carbon contained in the binder material cannot be removed completely, so that desired effects cannot be obtained.

Taking the points described above into consideration, shape, dimension or arrangement of the grooves are preferably set to the following ranges respectively, i.e., the groove depth ranges from 10 to 200 $\mu$m, the groove width ranges from 30 to 500 $\mu$m, the groove pitch ranges from 0.5 to 10 mm. It is more preferable to set the groove depth to a range of 30 to 60 $\mu$m, the groove width to a range of 50 to 150 $\mu$m and the groove pitch to a range of 1.0 to 3.0 mm.

By the way, a plurality of grooves may have various arrangements such as in parallel or in lattice manner, also shapes of the grooves may be U-shaped or V-shaped in section.

On the other hand, when a through hole is formed as a communication hole in a copper circuit plate or the like, it is preferable to set a diameter of the through hole to a range of 30 to 500 $\mu$m. In a case where a plurality of holes are arranged in a form of a lattice, the hole pitch is preferably set to a range of 0.5 to 10 mm. It is more preferable to set the hole diameter to a range of 50 to 150 $\mu$m, and the hole pitch to a range of 1.0 to 3.0 mm.

According to the ceramic circuit board described above, the active metal such as Ti would not react with C contained in the binder material but reacts with N or O contained in the ceramic base board to thereby generate TiN, TiO or the like in the bonding layer. Therefore, the strength dispersion caused by a non-bonded portion can be effectively eliminated at the bonding layer between the ceramic base board and the copper circuit plate, thus enhancing the bonding strength and providing a ceramic circuit board having a stable performance.

According to the present invention, there is provided a ceramic circuit board characterized by comprising: a ceramic base board; a metal circuit plate integrally bonded onto one surface of the ceramic base board through a first bonding layer containing an active metal selected from the group consisting of Ti, Zr, Hf, V, Nb and Ta; a backing metal plate for preventing thermal deformation, which is integrally bonded onto another surface of the ceramic base board through a second bonding layer containing the active metal; a semiconductor chip bonded onto a surface of the metal circuit plate through a first solder layer; and a heat sink for releasing heat bonded onto a surface of the backing metal plate through a second solder layer; and the metal circuit plate and the backing metal plate being provided with communication holes respectively at each of the bonding surfaces so as to communicate each of the bonding surfaces with an outside of the ceramic base board.

Namely, the ceramic circuit board according to the invention has a construction wherein the ceramic base board is disposed between the metal circuit plate and the backing metal plate, both the metal circuit plate and the backing metal plate being provided with the communication holes such as grooves or through holes. A material for the ceramic base board and shapes of the grooves or the like may be set similarly to those of the previously described invention.

According to the invention, dispersion in bonding strength caused by non-bonding is effectively eliminated not only in the bonding layer between the ceramic base board and the metal circuit plate but also in the bonding layer between the ceramic base board and the backing metal plate, thus enhancing the bonding strength and providing a ceramic circuit board having a stable performance.

Next, according to the present invention, there is provided a ceramic circuit board characterized by comprising: a ceramic base board; a metal circuit plate integrally bonded onto a surface of the ceramic base board through a bonding layer containing an active metal selected from the group consisting of Ti, Zr, Hf, V, Nb and Ta; and a semiconductor chip bonded onto a surface of the metal circuit plate through a solder layer; and the metal circuit plate being provided with a groove at the bonding surface with respect to the semiconductor chip so as to communicate the bonding surface with an outside of the semiconductor chip.

According to the invention wherein the grooves are formed onto the solder layer side of the copper circuit plate, when the semiconductor chip such as Si chip is soldered onto the surface of the metal circuit plate, an atmospheric gas or air is exhausted and removed from the soldering surface to the outside of the semiconductor chip through the grooves, so that the solder void due to a gas pocket merely occurs. Further, it becomes possible to reduce a thermal resistance in the solder layer of the finished product.

In the present invention, preferred examples of the method for forming the communication holes such as grooves to be formed onto the copper circuit plate may include: a mechanical method such as pressing by utilizing a pressing machine; a chemical working method such as an etching treatment.

If at least one of a size, arranging number and arranging density of the grooves is so large that a large amount of solder is required, the metal circuit plate will become liable to be broken whereby it becomes difficult to work the grooves. On the other hand, in a case where the size, arranging number, arranging density of the grooves are so small that the atmospheric gas or air cannot always be removed completely resulting in causing the solder void and deteriorating the bonding strength due to the solder void, the thermal resistance is increased in the ceramic circuit board as a final product whereby desired effects cannot be obtained.

Taking the points described above into consideration, the shape or arrangement of the grooves are preferably set to the following ranges respectively, i.e., the groove depth may range from 10 to 300 $\mu$m, the groove width ranges from 30 to 1000 $\mu$m, the groove pitch ranges from 0.5 to 10 mm. It is more preferable to set the groove depth to a range of 50 to 150 $\mu$m, the groove width to a range of 100 to 200 $\mu$m and the groove pitch to a range of 1.0 to 3.0 mm. By the way, a plurality of grooves may have various arrangements such as in a parallel or lattice manner, also shapes of the grooves may be U-shaped or V-shaped in section.

According to the present invention, there is provided a ceramic circuit board characterized by comprising: a ceramic base board; a metal circuit plate integrally bonded onto one surface of the ceramic base board through a first bonding layer containing an active metal selected from the group consisting of Ti, Zr, Hf, V, Nb and Ta; a backing metal plate for preventing thermal deformation, the backing metal plate being integrally bonded onto another surface of the ceramic base board through a second bonding layer containing the active metal; a semiconductor chip bonded onto a surface of the metal circuit plate through a first solder layer; and a heat sink for releasing heat bonded onto a surface of the backing metal plate through a second solder layer, the metal circuit plate and the backing metal plate being provided with grooves respectively at each of the bonding surfaces of the first and second solder layer sides so as to communicate each of the bonding surfaces with an outside of the semiconductor chip.

Namely, the ceramic circuit board according to the invention has a construction wherein the ceramic base board is integrally disposed between the metal circuit board and the backing metal plate, both the metal circuit plate and the backing metal plate being provided with the grooves. A material of the ceramic base board and shapes of the grooves may be set similar to the case of those of the previously described invention.

According to the invention, when the semiconductor chip and the heat sink are soldered onto the surfaces of the metal circuit plates during the module assembling process, an atmospheric gas or air are exhausted and removed from the soldering surface to the outside of the ceramic circuit board through the grooves, so that solder voids due to gas pockets rarely occur.

The inventors of this invention have reviewed and researched the cause and effect relationship of the occurrence of cracks in the ceramic base board. As a result, the following facts have been cleared. That is, when a module in which the ceramic circuit board is loaded is operated for a long period of time, a temperature of the module is raised up to 100° C. or more. Due to the temperature rise, an entire ceramic circuit board is thermally expanded. At this time, a thermal coefficient of expansion of the copper circuit plate is larger than that of the ceramic base board, so that in a case where the copper circuit plate is bonded onto only one surface of the ceramic base board, a warpage is liable to occur. In order to prevent the warpage, the countermeasure such that the backing copper plate for preventing thermal deformation is bonded onto the other surface side of the ceramic base board is adapted.

However, even though such a countermeasure is applied, a difference of thermal expansions ($\alpha$ difference) occurs due to the temperature difference ($\Delta T$) caused by ON/OFF switching operation of the power source. Therefore, heat-cycles caused on the basis of the difference are repeatedly applied onto the ceramic base board, so that a compressive stress remains in the ceramic base board.

The compressive stress has a maximum value at a boundary portion between a bonded surface and a non-bonded surface of the copper circuit plate with respect to the ceramic base board. Namely, the boundary portion corresponds to a peripheral edge portion of the copper circuit plate to which the ceramic base board is contacted.

Figure 29:
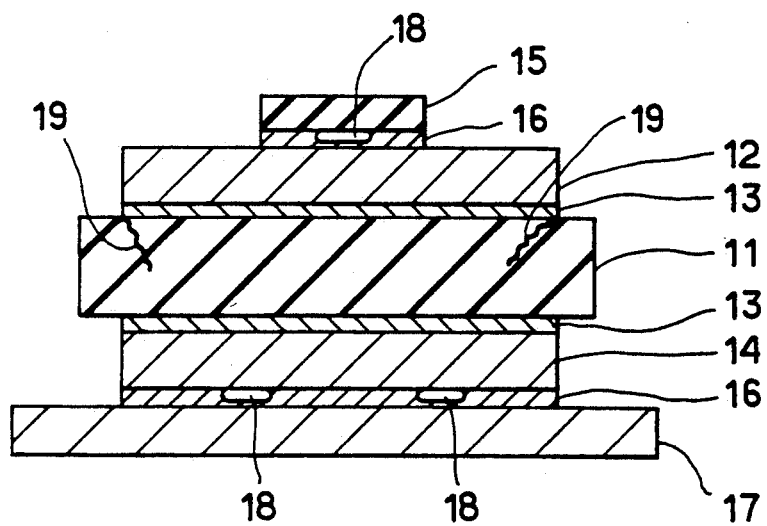
FIG. 29 is a sectional view showing a construction of another conventional ceramic circuit board manufactured by employing active metal brazing method.

As a result, as shown in FIG. 29, cracks 19 will be liable to occur at the portion where the edge peripheral portion of the copper circuit plate 12 and the ceramic base board 11 are contacted to each other. Then, a breakage of the ceramic base board 11 will occur from the crack 19 as a starting point, thus causing an adverse influence on the module.

By the way, a frequency of crack formation and size of the crack are remarkable in a case where a thickness of the copper circuit plate is large, so that it is considered that a stress to be applied in a direction of the bonding surface is synergistically influenced by the thickness of the copper circuit plate.

Accordingly, it is considered that the crack formation will be effectively prevented by mitigating the stress. Therefore, the thought of reducing the thickness of the copper circuit plate may easily occur. However, it is impossible to excessively reduce the thickness of the entire copper circuit plate particularly in a case where the ceramic circuit board is used for high-current devices such as a high-power transistor module, switching power source module or the like.

The present invention has been made on the basis of the above problems. The invention provides for a ceramic circuit board characterized in that an edge portion of the copper circuit plate is provided with a step portion having a thinner thickness than that of a central portion of the copper circuit plate.

According to the present invention described above wherein only the edge portion of the copper circuit plate has a thinner thickness, it is possible to reduce an amount of compressive strain which is caused by the difference of thermal expansion applied from the thinned portion to the ceramic base board, while the thickness of the main central portion of the copper circuit plate is retained so as to have a sufficient thickness. As a result, it becomes possible to prevent the crack formation at the boundary portion between the bonded surface and the non-bonded surface of the copper circuit plate with respect to the ceramic base board.

Accordingly, even in a case where the thickness of the entire copper circuit plate is set to a large value for the purpose of high-current supply, it becomes possible to prevent the crack formation with respect to the ceramic base board, thus enhancing the reliability of the ceramic circuit board.

Preferable examples of methods for forming the thinned portion (the step portion) may include: a chemical method wherein an outer peripheral portion of the non-bonding surface side of the copper circuit plate is trimmed or chipped by employing the etching method; and a mechanical method wherein an outer peripheral portion of the copper circuit plate is collapsed or crashed by employing a press machine.

According to the structure of the ceramic circuit board having the step portion at the periphery edge portion of the copper circuit plate, a formation of the thickness difference and a dimensional setting of the step portion can easily be performed.

The inventors of this invention have also found the following fact from the result of the various experimental data. Namely, when the thickness of the thinned portion to be formed at the edge portion of the copper circuit plate is larger than two-thirds ($\frac{2}{3}$) of that of the central portion of the copper circuit plate, it cannot always be possible to securely prevent the crack formation of the ceramic base board.

Accordingly, the thickness of the thinned portion to be formed at the peripheral edge portion of the copper circuit plate may preferably be set to two-thirds or less of that of the central portion of the copper circuit plate.

Further, when the width of the thinned portion to be formed at the edge portion of the copper circuit plate is less than a half of that of the central portion of the copper circuit plate, it cannot always be possible to securely prevent the crack formation of the ceramic base board.

Accordingly, the width of the thinned portion to be formed at the peripheral portion of the copper circuit plate may preferably be set to a half or more of that of the central portion of the copper circuit plate.

Next, the present invention provides for a ceramic circuit board characterized by comprising a ceramic base board and a metal circuit plate bonded onto the ceramic base board, an edge portion of the metal circuit plate being provided with a slant surface having a small thickness in comparison with that of a main central portion of the metal circuit plate.

Also, according to the invention, it is possible to reduce a stress applied from the metal circuit plate to the ceramic base board. Due to the stress relaxation, it becomes possible to prevent the crack formation at the boundary portion between the bonded surface and the non-bonded surface of the metal circuit plate with respect to the ceramic base board.

Accordingly, even in a case where the thickness of the entire copper circuit plate is set to a large value for the purpose of high-current service, it becomes possible to prevent the crack formation with respect to the ceramic base board, thus enhancing the reliability of the ceramic circuit board.

Preferred examples of methods of forming the thinned portion, i.e., the slant surface may include: a chemical method wherein an outer peripheral portion of the non-bonding surface side of the metal circuit plate is trimmed or chipped by employing the etching method; and a mechanical method wherein the outer peripheral portion of the metal circuit plate is collapsed or crashed by employing a pressing machine.

In this case, when an inclination angle of the slant surface of the metal circuit plate is less than 20 degrees, there may be posed disadvantages such that it becomes difficult to work the metal circuit plate, and difficult to secure an area on the metal circuit plate for loading a semiconductor chip thereon. On the other hand, when the inclination angle of the slant surface of the metal circuit plate is larger than 70 degrees, it is not always possible to securely prevent the crack formation.

Accordingly, in the present invention, the inclination angle of the slant surface of the metal circuit plate may preferably be set to a range of 20 to 70 degrees.

The invention provides for a ceramic circuit board characterized by comprising: a ceramic base board; a metal circuit plate integrally bonded onto a surface of the ceramic base board through a bonding layer containing an active metal selected from the group consisting of Ti, Zr, Hf, V, Nb and Ta; the metal circuit plate having a terminal connecting port for connecting a terminal of a module; and a gap partially formed between the surface of the ceramic base board and the metal circuit plate.

The ceramic circuit board according to the present invention has a construction having a gap (non-bonded portion) formed between the terminal connecting port of the metal circuit plate and the ceramic base board.

Due to the formation of the gap, the metal circuit plate positioned above the gap may have a spring-like function.

Therefore, it is possible to mitigate or relax the mechanical stress applied in accordance with a movement or replacement of the terminal which had been connected to the terminal connecting port of the metal circuit plate in the module assembling process. Simultaneously, it can be effectively prevented that heat-cycle effects from the terminal are directly applied to the bonded portion, thus greatly enhancing the reliability of the terminal connecting port.

PREFERRED EMBODIMENTS OF THE INVENTION

Hereinbelow, reference will now be made in detail to the preferred embodiment of the present invention, an example of which is illustrated in the accompanying drawings.

FIG. 1 is a partial sectional view showing a ceramic circuit board according to a first embodiment of the present invention, wherein the same reference numerals are used to denote the same elements or members as those of the conventional ceramic circuit board explained in connection with FIG. 26.

As each of Samples 1 to 5 (embodiments 1 to 5), various types of the ceramic circuit boards as shown in FIG. 1 were manufactured in accordance with the following manufacturing process. That is, a ceramic base board substantially composed of aluminum nitride containing 5 wt. % of yttrium oxide, 5 wt. % of alumina and 5 wt. % of silicon dioxide and having a thickness of 0.635 mm was prepared. Then, the ceramic base board was heated up to a temperature of 1100° to 1250° C. for 1 to 5 hours in air atmosphere thereby to form an oxidated layer on the surface of the ceramic base board.

On the other hand, a tough pitch electrolytic copper plate having a thickness of 0.3 mm was punched out and subsequently bent by means of a punching-press machine to thereby prepare various types of copper circuit plates 7A to 7E each having a width of 3 mm and a terminal connecting port so that the radius of curvature $R_1$, $R_2$ of the bent portions $P_3$, $P_4$ of the terminal connecting port 3A to 3E was either one of 0.2 ram, 0.3 ram, 0.4 ram, 0.5 mm and 0.6 mm, respectively.

Subsequently, each of the copper circuit plates 7A to 7E was contacted onto the oxidated layer formed on the respective ceramic base board and integrally bonded by employing the DBC method. Namely, each of the copper circuit plates 7A to 7E having the terminal connecting port 3A to 3E was contacted to the ceramic base board 1 to form an assembled body. Then, the assembled body was heated up to a temperature which enables the generation of a eutectic liquid phase composed of copper (Cu), copper oxide ($Cu_2O$) and oxygen (O) for 10 minutes under a nitrogen gas atmosphere, to thereby integrally bond the copper circuit plate 7A to 7E with the respective ceramic base board 1. The other end of the respective terminal connecting ports 3A to 3E was raised from the upper surface of the ceramic base board 1 so as to form a cantilever.

In the next step, a Ni metallizing layer 6 having a thickness of 3 μm was formed on a surface of the respective copper circuit plates 7A to 7E. Then, a terminal 4 of a module was bonded to the terminal connecting port 3A to 3E through the solder 5 whereby ceramic circuit boards according to Samples 1 to 5 as shown in FIG. 1 were manufactured respectively.

On the other hand, a ceramic circuit board of Comparative Sample 1 was manufactured in the same manner as in Sample 1 except that the radius of curvature $R_1$, $R_2$ were respectively set to 0.1 mm which is the same value as that of a conventional one.

Further, a ceramic circuit board of Comparative Sample 2 was manufactured in the same manner as in Sample 1 except that the Ni plating layer was not formed.

In order to evaluate the thus manufactured ceramic circuit boards according to Samples 1 to 5 and Comparative Samples 1 to 2, a vibration test was conducted. That is, the vibration test was carried out under the conditions that the terminal 4 connected to the respective terminal connecting ports was forcibly vibrated in the direction indicated by an arrow in FIG. 1. The vibration frequency was set to one cycle per second and the amplitude of the vibration was set to 1 mm. Under such conditions, a number of vibrating cycles were measured until either one of the bent portion $P_3$, $P_4$ of the terminal connecting port caused a breakage. The test results are shown in FIG. 2.

Figure 2:
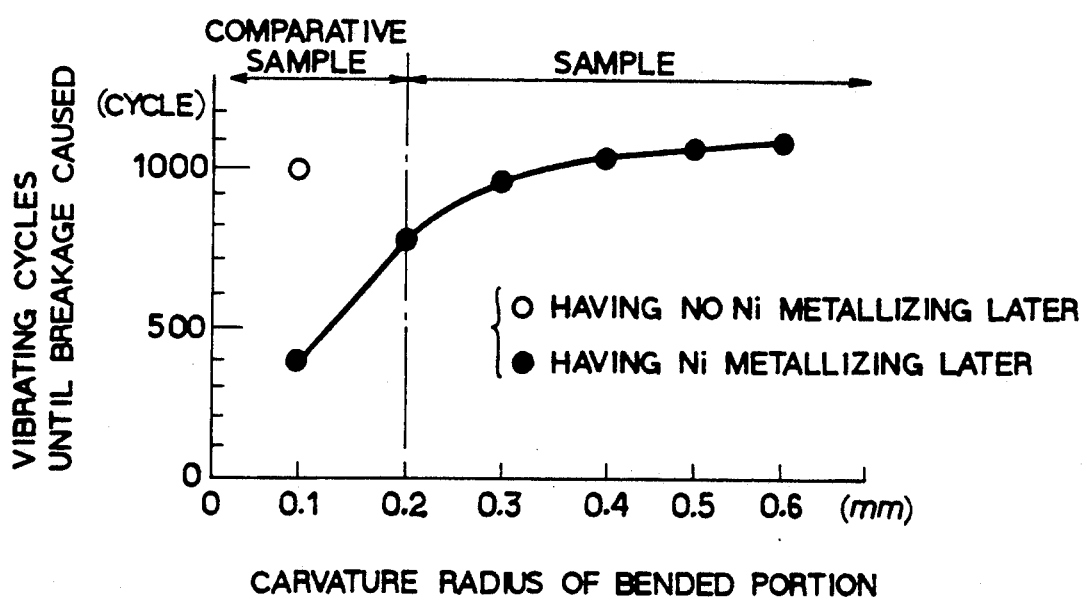
FIG. 2 is a graph showing a relationship between the curvature radius of a terminal connecting port and a number of bending cycles until breakage of the terminal connecting port occurs.

As is clear from the results shown in FIG. 2, in the case of the ceramic circuit boards according to Samples 1 to 5 in which the radius of curvature R of the bent portion $P_3$, $P_4$ were set to 0.2 mm or more, the number of vibrating cycles were remarkably increased in comparison with the Comparative Sample 1 in which the radius of curvature was set to 0.1 mm. Therefore, it is confirmed that the ceramic circuit board according to the present invention may have a high durability.

In particular, when the radius of curvature R was set to 0.3 mm or more, there could be obtained a number of vibrating cycles equal to or larger than that of the ceramic circuit board according to Comparative Sample 1 having no Ni plating layer.

Namely, though the terminal connecting ports were hardened due to the formation of the Ni plating layer in the Samples 1 to 5, the copper circuit plates of the Samples 1 to 5 have the same bending strength and fatigue strength as those of the copper circuit plate having no Ni plating layer, thus enhancing the reliability of the ceramic circuit board.

As described above, according to the ceramic circuit board of the first invention, the terminal connecting port is formed in a cantilever shape and the radius of curvature of the bent portion formed in the terminal connecting port is largely set to 0.2 mm or more, so that the stress concentration to the bent portion can effectively be prevented. Accordingly, there can be provided a ceramic circuit board having a high strength and no fear of occurrence of crack or breakage in the metal circuit plate.

More particularly, even in a case where the temperature variation caused by ON/OFF switching operation of the power source is repeatedly applied onto the terminal connecting port, it can effectively prevent the terminal connecting port from causing the crack or breakage.

Next, the preferred embodiments according to the second invention will now be explained with reference to the accompanying drawings.

Embodiment 6 (FIGS. 3 to 7)

Figure 3:
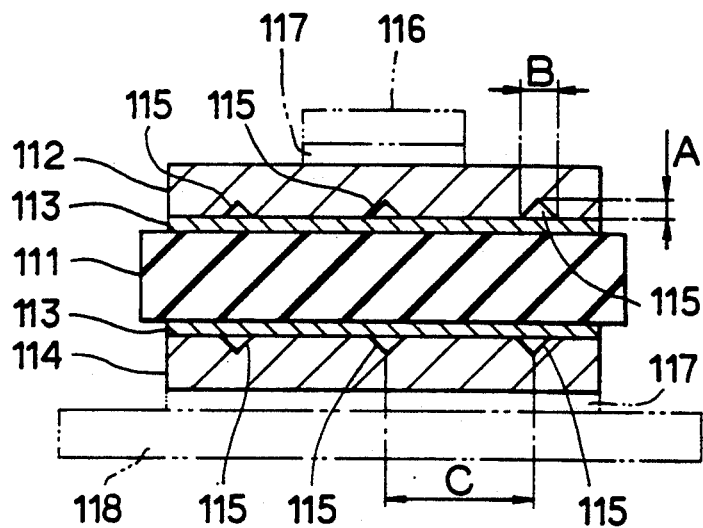
FIG. 3 is a sectional view showing a sixth embodiment of a ceramic circuit board according to the present invention.
Figure 4:
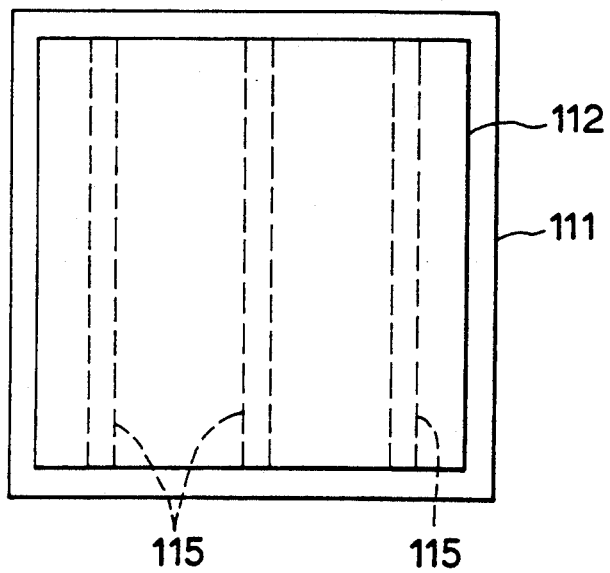
FIG. 4 is a plan view showing the sixth embodiment of the ceramic circuit board shown in FIG. 3.
Figure 5:
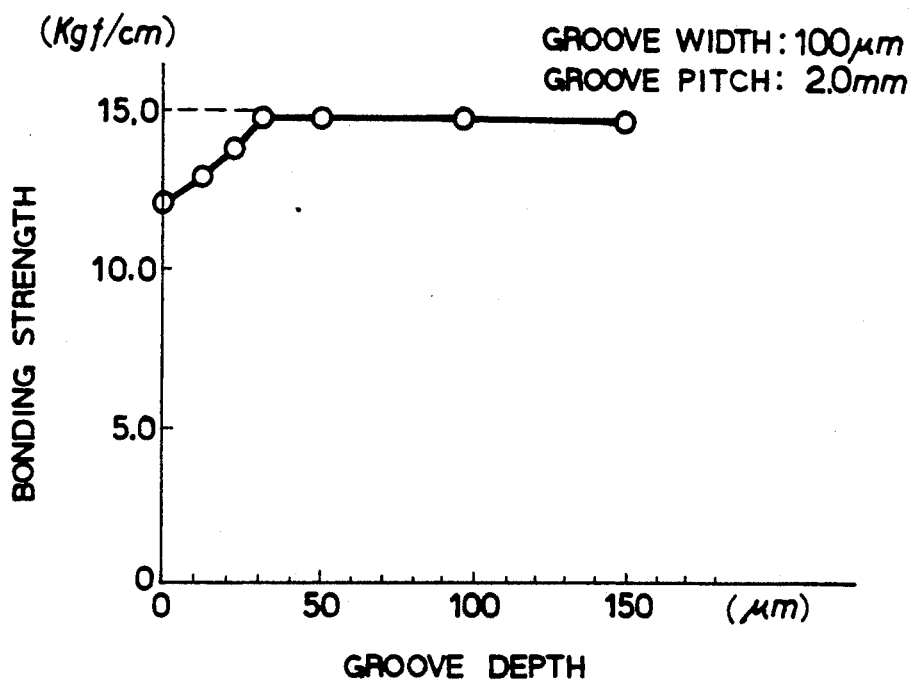
FIG. 5 is a graph showing a relationship between groove depth and bonding strength in the sixth embodiment of the present invention.
Figure 6:
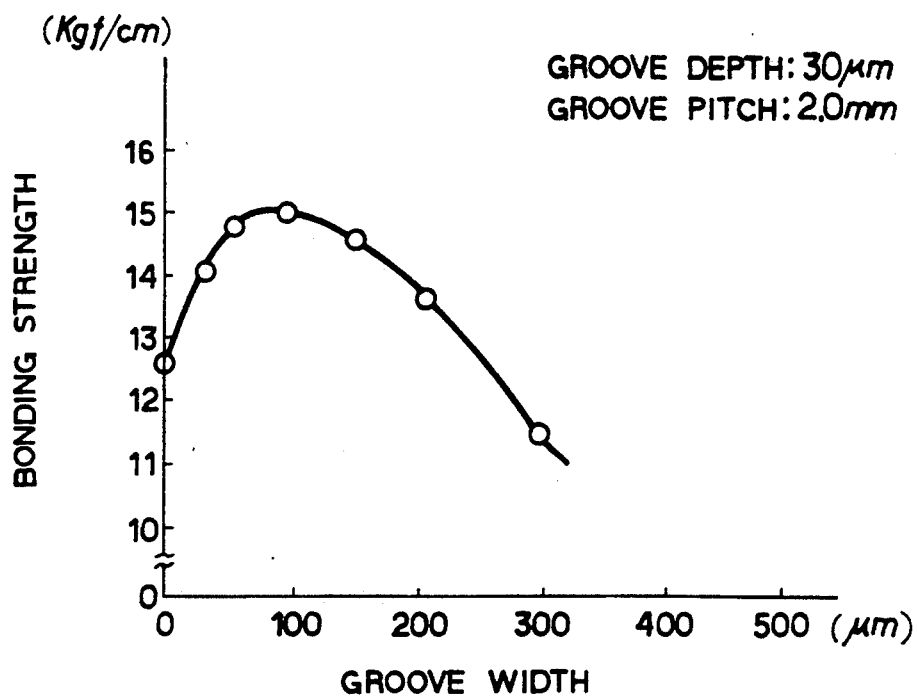
FIG. 6 is a graph showing a relationship between groove width and bonding strength in the sixth embodiment of the present invention.
Figure 7:
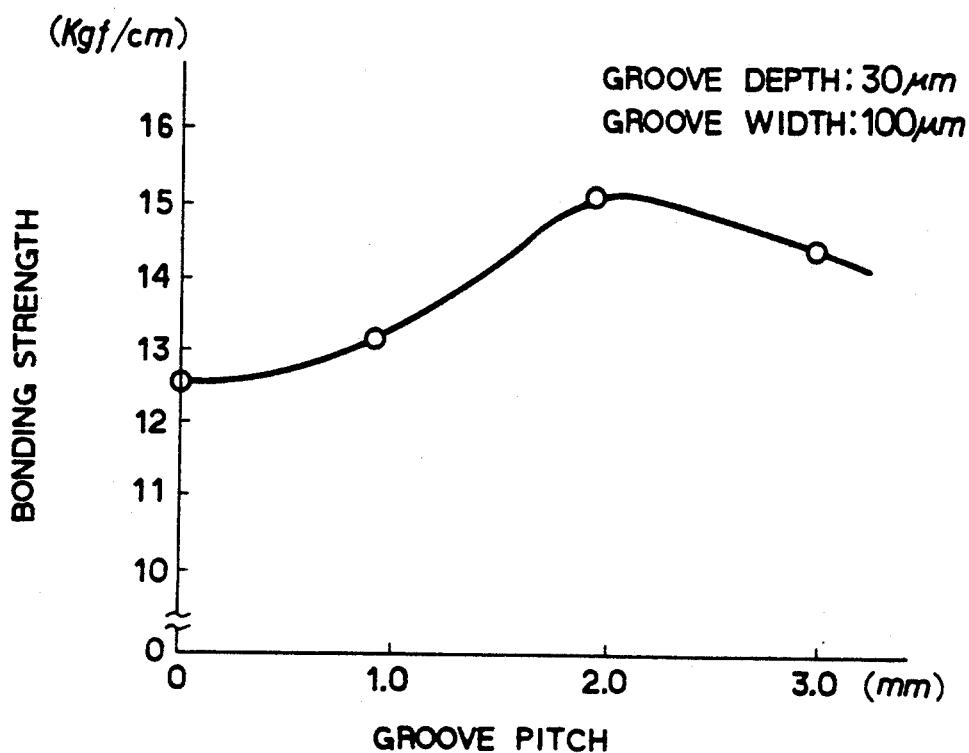
FIG. 7 is a graph showing a relationship between groove pitch and bonding strength in the sixth embodiment of the present invention.

FIG. 3 is a sectional view showing a construction of the sixth embodiment of the present invention; FIG. 4 is a plan view of FIG. 3; and FIGS. 5 to 7 are graphs showing characteristics of the ceramic circuit board according to the sixth embodiment of the present invention respectively.

As shown in FIGS. 3 and 4, a copper circuit plate 112 was bonded onto one surface of a ceramic base board composed of A1N through a bonding layer 113 by employing an active metal brazing method. At the same time, an auxiliary backing copper plate 104 for preventing thermal deformation was bonded onto the other surface side of the ceramic base board 111 through a bonding layer 113 by employing the same brazing method.

That is, a powder mixture material composed of 5 wt. % of Ti, 30 wt. % of Ag and 65 wt. % of Cu was added to a binder such as an organic compound or the like and solvent. Then, the mixture was well mixed to prepare a paste, and a pattern was printed onto the ceramic base board 111. Subsequently, the copper circuit plate 112 was arranged onto the upper surface of the ceramic base board 111 in along with the pattern formed thereon. In this state, the ceramic base board and the copper circuit plate were heated in argon (Ar) gas atmosphere to thereby be integrally bonded to each other through the bonding layer 113. A backing copper plate 114 was also bonded onto another side of the ceramic base board 111 in the same manner.

On the bonding layer 113 side surfaces of the respective copper circuit plates 112 and 114, there were previously formed grooves 115 by means of press working.

Each of the grooves 115 has an approximately V-shape in section and has openings at both edge portions of the copper circuit board. The grooves were arranged in parallel to each other so as to have a predetermined pitch. The dimensions of the groove were set to 30 μm of depth A, 100 μm of width B and 2.0 mm of pitch C.

In the assembling process of the module as a final product, as indicated by the imaginary line in FIG. 3, a Si chip 116 was bonded onto the surface of the copper circuit plate 112 through a solder layer 117, while the backing copper plate 114 was bonded onto the heat sink 118 through another solder layer 117.

With respect to the ceramic circuit board according to the sixth embodiment, a compound composition of the bonding layer 113 was analyzed and investigated. As a result of the analysis, there was essentially no generation of TiC, and it was confirmed that only TiN and TiO existed in the bonding layer. Also, the bonding strength of the bonding layer was measured to be 15 kgf/cm expressed as a peeling strength.

Many other ceramic circuit boards having the same construction as that of the sixth embodiment were manufactured, subsequently analyzed and the characteristics thereof evaluated. As a result, the same or similar results were obtained with respect to the compound composition and the bonding strength.

Furthermore, various type of ceramic circuit boards were manufactured by varying the dimensions such as groove depth A, groove width B and groove pitch C, respectively. Then, a relationship between the groove dimensions and the bonding strength of the bonding layer was investigated. The results of the investigation are shown in FIGS. 5 to 7.

That is, FIG. 5 is a graph showing a relationship between the groove depth A and the bonding strength; FIG. 6 is a graph showing a relationship between the groove width B and the bonding strength; FIG. 7 is a graph showing a relationship between the groove pitch C and the bonding strength, respectively.

As is clear from FIGS. 5 to 7, preferred setting ranges of the dimensions of the groove are as follows, i.e., the groove depth A may preferably be set to a range of 10 to 200 μm, the groove width B of 30 to 500 μm and the groove pitch of 0.5 to 10 mm. More preferably, the groove depth A may be set to a range of 30 to 60 μm, the groove width B of 50 to 150 μm and the groove pitch C of 1.0 to 3.0 mm.

Embodiment 7 (FIGS. 8 to 11)

Figure 8:
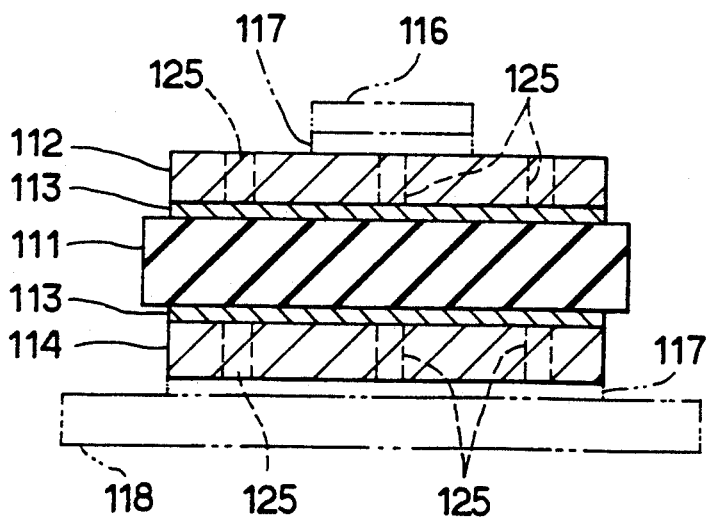
FIG. 8 is a sectional view showing a construction of a seventh embodiment of a ceramic circuit board according to the present invention.
Figure 9:
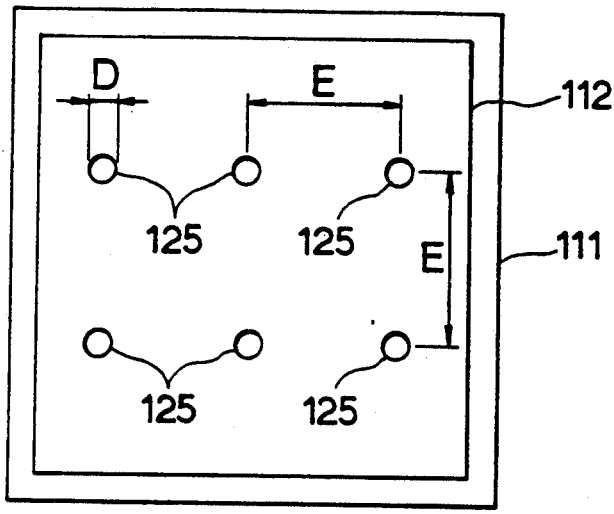
FIG. 9 is a plan view showing a construction of the seventh embodiment of a ceramic circuit board shown in FIG. 8.
Figure 10:
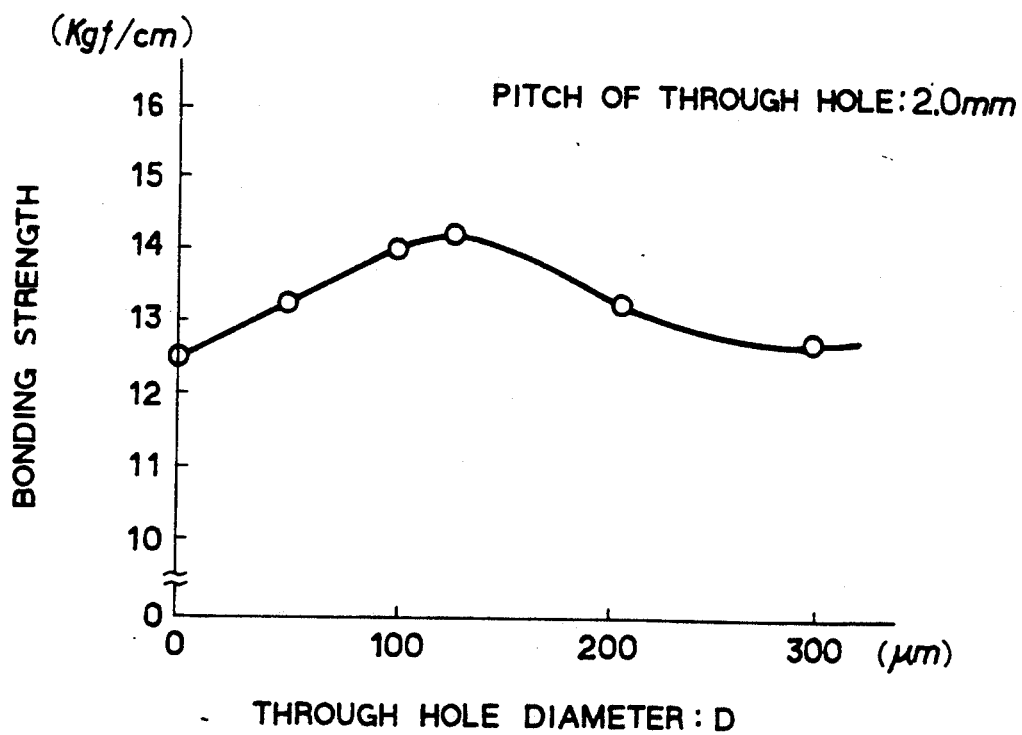
FIG. 10 is a graph showing a relationship between the hole diameter and the bonding strength in the seventh embodiment of the present invention.
Figure 11:
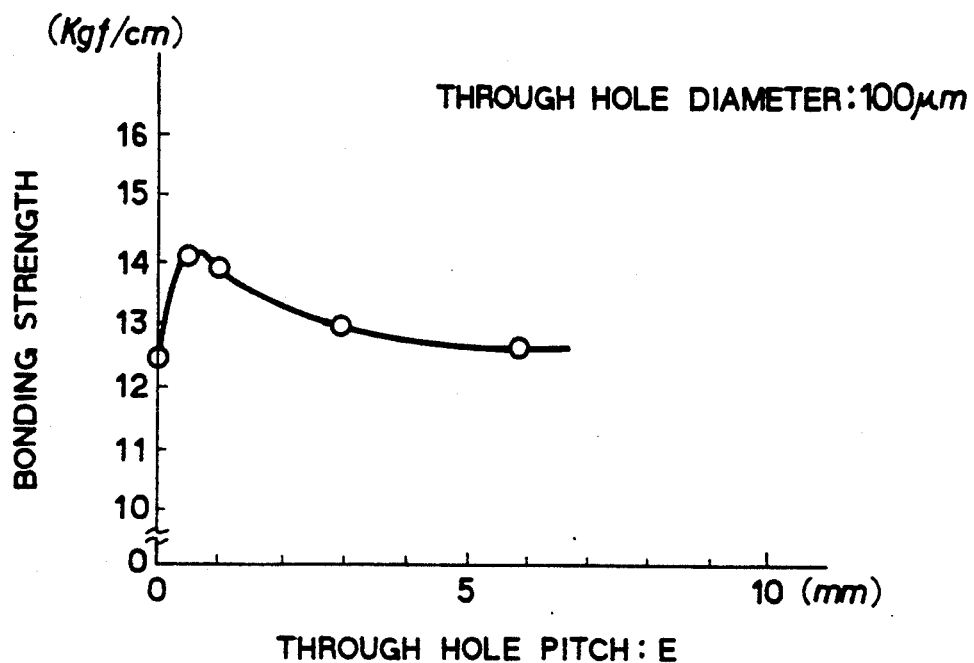
FIG. 11 is a graph showing a relationship between the hole pitch and the bonding strength in the seventh embodiment of the present invention.

FIG. 8 is a sectional view showing a construction of the seventh embodiment of the present invention; FIG. 9 is a plan view of FIG. 8; and FIGS. 10 and 11 are graphs showing characteristics of the ceramic circuit board according to the seventh embodiment of the present invention respectively.

As shown in FIGS. 8 and 9, the ceramic circuit board according to the seventh embodiment is different from that of the sixth embodiment in a point that a plurality of through holes 125 were formed in the copper circuit plate 112 and the backing copper plate 114 in place of the grooves 115 formed in the sixth embodiment. The through holes 125 were formed so as to pass through along a direction perpendicular to a plane of the copper circuit plate 112 and the backing copper plate 114.

In the seventh embodiment as shown in FIG. 9, the respective through hole 125 was set to be a circular hole having a diameter D of 100 μm, and a plurality of the through holes were arranged in a lattice-like manner so as to have a hole pitch E of 2.0 mm.

The arrangement of elements or parts of the ceramic circuit board of the seventh embodiment shown in FIGS. 8 and 9 other than those described above are substantially the same as those of sixth embodiment shown in FIGS. 3 and 4, so that these elements or parts are not described herein by adding the same reference numerals to the corresponding elements or parts.

With respect to the ceramic circuit board according to the seventh embodiment, a compound composition of the bonding layer 113 was analyzed and investigated. As a result of the analysis, there was essentially no generation of TiC, and it was confirmed that only TiN and TiO existed in the bonding layer 113. Also, the bonding strength of the bonding layer was measured to be a 14 kgf/cm.

Many other ceramic circuit boards having the same construction as that of the seventh embodiment were manufactured, subsequently analyzed and the characteristics thereof evaluated. As a result, the same or similar results were obtained with respect to the compound composition and the bonding strength.

Furthermore, various types of ceramic circuit boards were manufactured by varying the dimensions such as through hole diameter D and through hole pitch E, respectively. Then, a relationship between the through hole dimensions and the bonding strength of the bonding layer was investigated. The results of the investigation are shown in FIGS. 10 and 11.

That is, FIG. 10 is a graph showing a relationship between the diameter D of the through hole 125 and the bonding strength; FIG. 11 is a graph showing a relationship between the hole pitch E and the bonding strength, respectively.

As is clear from FIGS. 10 and 11, preferable setting ranges of the dimensions of the through hole are as follows, i.e., the diameter D of the through hole may preferably be set to a range of 30 to 500 μm, and the hole pitch of 0.5 to 10 mm in a case where the plurality of through holes are arranged in a lattice-like form. More preferably, the diameter D of the through hole may be set to a range of 50 to 150 μm and the hole pitch E of 1.0 to 3.0 mm in a case where the plurality of through holes are arranged in a lattice-like form.

Next, an eighth embodiment according to the present invention will be explained with reference to the accompanying drawings.

Embodiment 8 (FIGS. 12 to 16)

Figure 12:
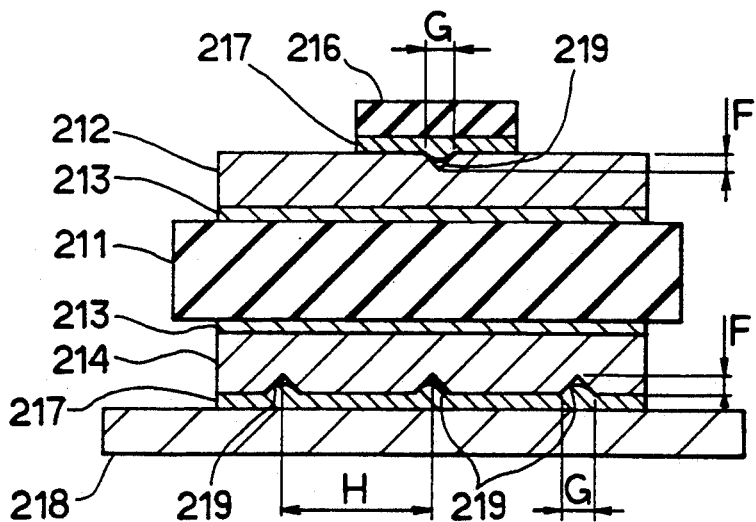
FIG. 12 is a sectional view showing a construction of an eighth embodiment of a ceramic circuit board according to the present invention.

FIG. 12 is a sectional view showing a construction of the eighth embodiment of the present invention; and FIGS. 13 to 16 are graphs showing characteristics of the ceramic circuit board according to the eighth embodiment of the present invention respectively.

As shown in FIG. 12, a copper circuit plate 212 was bonded onto one surface of a ceramic base board 211 composed of A1N through a bonding layer 213 by employing the active metal brazing method. At the same time, an auxiliary backing copper plate 204 for preventing thermal deformation was bonded onto the other surface side of the ceramic base board 211 through a bonding layer 213 by employing the same brazing method.

By the way, a material for the bonding layer 213 and the bonding method were the same as those adopted in the sixth and seventh embodiments. On the bonding layer 213 sides of the copper circuit plate 212 and the backing copper plate 214, grooves (not shown) were respectively provided, which were the same as those formed in the sixth embodiment.

Furthermore, in the assembling process of the module as a final product, a Si chip 216 was bonded onto the surface of the copper circuit plate 212 through the solder layer 217, while the backing copper plate 214 was bonded onto the heat sink 218 through the solder layer 217. The thickness of the copper circuit plate 212 was set to 0.4 mm, and a plane size of the Si chip was set to 10 mm × 10 mm. Also, the grooves 219 were formed at the solder layer 217 side surface of the copper circuit plate 212 and the backing copper plate 214, respectively.

Each of the grooves 219 had an approximately V-shape in section and had openings at both edge portions of the copper circuit plate 212 and the backing copper plate 214. The grooves 219 were arranged in parallel to each other so as to have a predetermined pitch. The dimensions of the grooves 219 were set to 100 μm of depth F, 300 μm of width G and 2.0 mm of pitch H. These grooves 219 were almost filled with solder which had been flown from the solder layer 217 during a bonding process, while an extremely small passage was left at a bottom portion of the respective groove 219.

With respect to the ceramic circuit board according to the eighth embodiment, a composition of the solder layer 217 was analyzed and investigated. As a result of the investigation, it was confirmed that an occurrence rate of the solder void to be caused in the solder layers 217 was remarkably reduced to about 4%.

Figure 13:
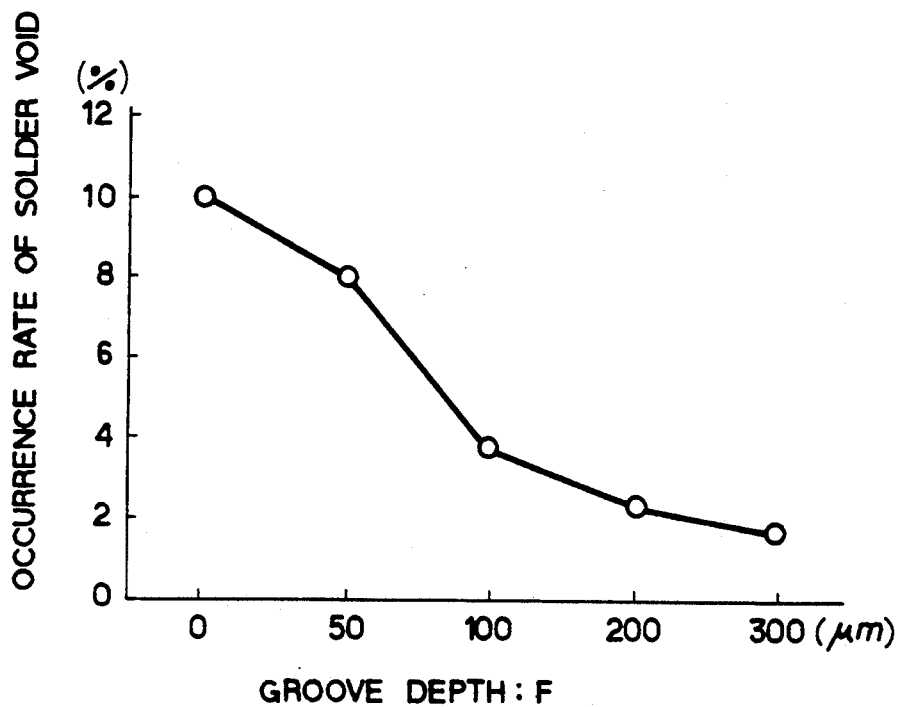
FIG. 13 is a graph showing a relationship between groove depth and occurrence rate of solder void in the eighth embodiment of the present invention.

Furthermore, various type of ceramic circuit boards were manufactured by varying the dimensions such as groove depth F, respectively. Then, a relationship between the groove depth F and the occurrence rate of the solder void was investigated. The results of the investigation are shown in FIG. 13.

Figure 14:
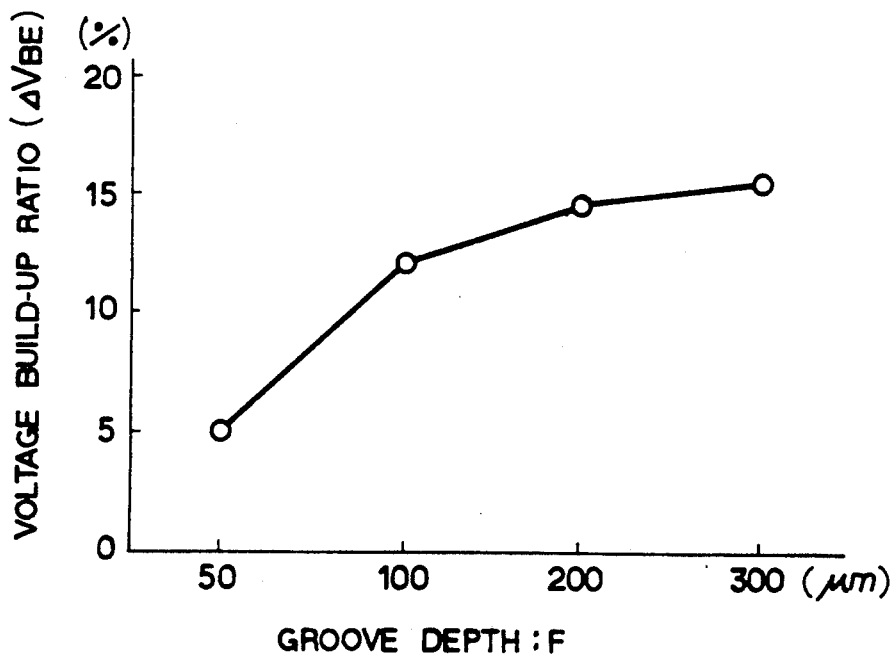
FIG. 14 is a graph showing a relationship between groove depth and voltage dropping ratio in the eighth embodiment of the present invention.

With respect to the thus manufactured ceramic circuit boards according to the eighth embodiment, voltage build-up ratios ($\Delta V_{EE}$) at the solder layer 217 were measured under conditions such as voltage of 45 V, current of 1A and time of 0.1 second. The results are shown in FIG. 14.

In the case of the conventional ceramic circuit board having no grooves, a fraction defective i.e., a ratio of defective product which was out of an allowance defined in a product specification was about 2%. On the contrary, in the case of the eighth embodiment of the present invention, the fraction defective was 0% due to the formation of the grooves 219.

Figure 15:
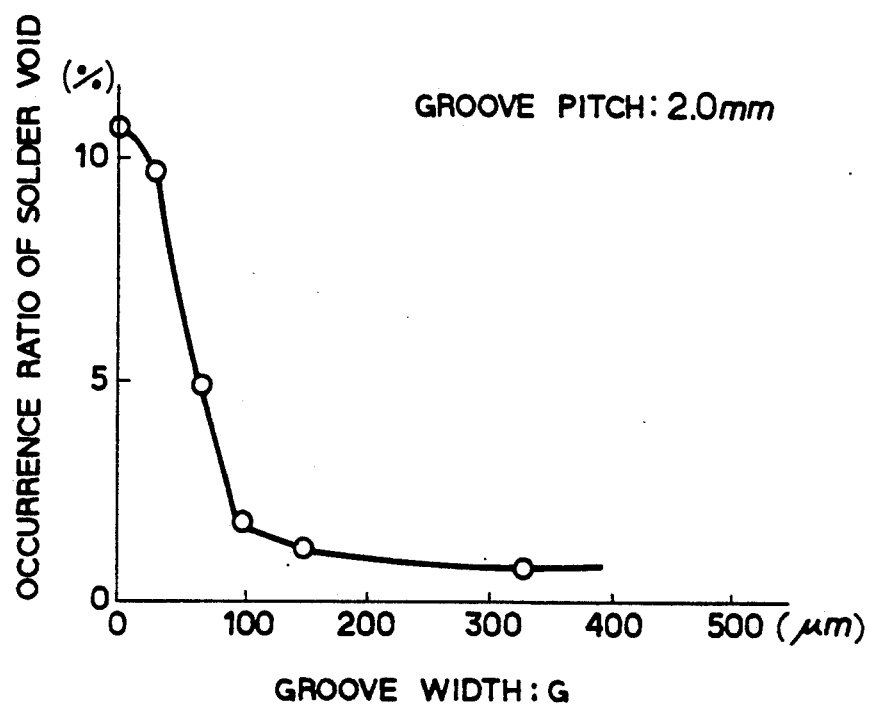
FIG. 15 is a graph showing a relationship between groove width and occurrence ratio of solder void in the eighth embodiment of the present invention.
Figure 16:
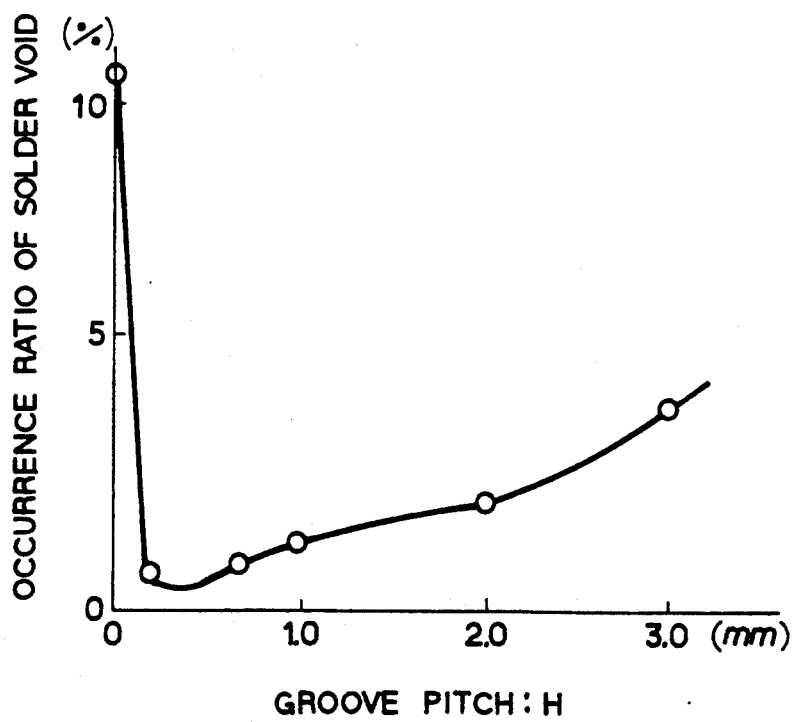
FIG. 16 is a graph showing a relationship between groove pitch and occurrence ratio of solder void in the eighth embodiment of the present invention.

Further, FIG. 15 is a graph showing a relationship between the groove width G and the occurrence ratio of the solder void; FIG. 16 is a graph showing a relationship between the groove pitch H and the occurrence ratio of the solder void, respectively.

As is clear from FIGS. 15 and 16, preferred setting ranges of the dimensions of the groove may be as follows: i.e., the groove depth F may preferably be set to a range of 10 to 300 μm, the groove width G of 30 to 1000 μm and the groove pitch of 0.5 to 10 mm. More preferably, the groove depth F may be set to a range of 50 to 150 μm, the groove width G of 100 to 200 μm and the groove pitch H of 1.0 to 3.0 mm.

As described above, according to the eighth embodiment of the present invention, the following effects are advantageously obtained:

(1) The communication holes such as grooves or through holes for communicating the bonding surface with an outside of the ceramic circuit board are formed on the bonding layer side surface of the copper circuit plate or the like to be bonded by employing the active metal brazing method, so that the binder contained in the brazing material is easily and completely removed through the grooves or the through holes whereby a correct and stable bonding structure can be obtained. Therefore, there may be no fear of occurrence of a product having a non-bonded portion or less bonding strength, thus enabling the increase of the production yield and the stabilization of the quality of the ceramic circuit board;

(2) The communication holes such as grooves or through holes for communicating the bonding surface with an outside of the ceramic circuit board are formed on the solder layer side surface of the copper circuit plate or the like, so that the atmospheric gas or air is easily and completely removed through the grooves or the through holes at the time of solder-bonding operation.

Therefore, there may be no fear of occurrence of a solder void, to thereby enable the effective reduction of the non-bonded portion, thus enabling the enhancement of the bonding strength and the improvement of the reliability of the semiconductor chips.

Next, the ninth embodiment of the present invention will be explained with reference to the accompanying drawings.

Embodiment 9 (FIGS. 17 to 20)

Figure 17:
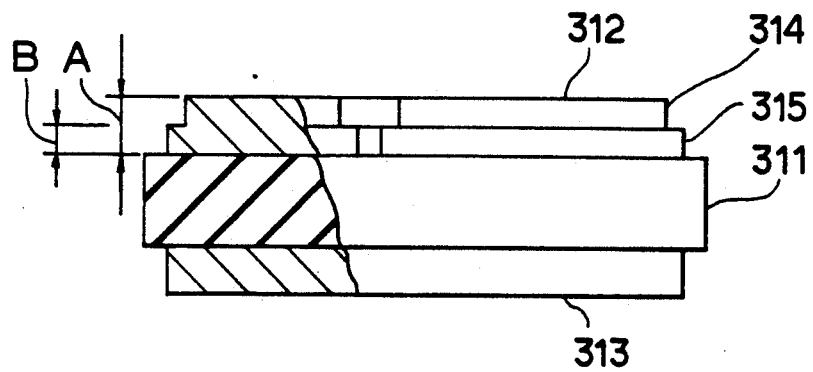
FIG. 17 is a side view showing partially in section a construction of a ninth embodiment of a ceramic circuit board according to the present invention.
Figure 18:
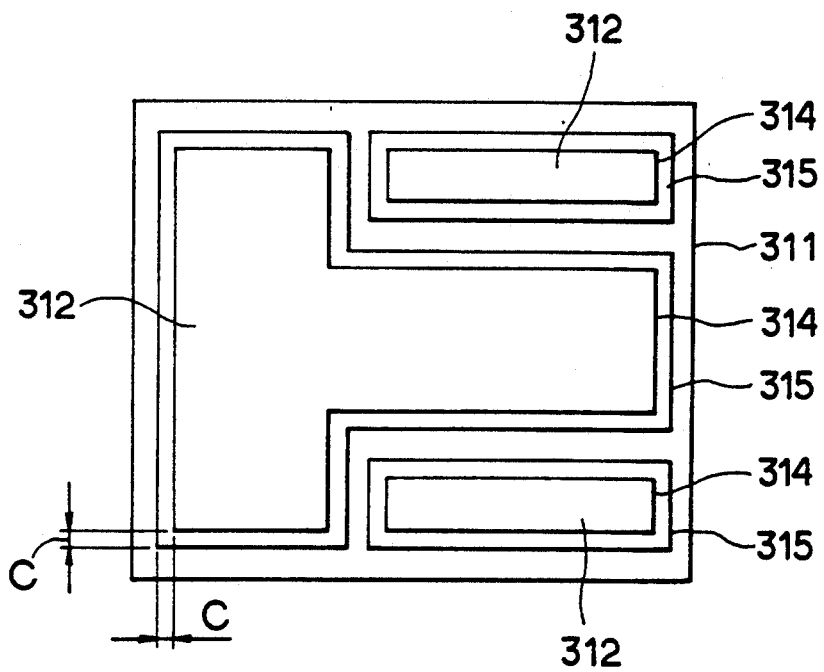
FIG. 18 is a plan view showing the ninth embodiment of the ceramic circuit board shown in FIG. 17.
Figure 19:
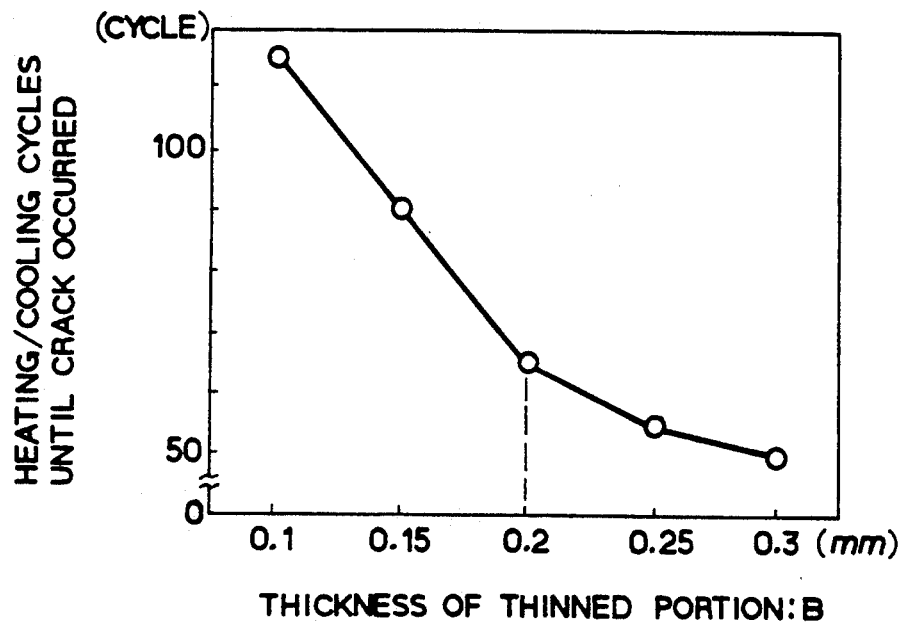
FIG. 19 is a graph showing a relationship between the thickness of a thinned portion and the number of heat cycles until a crack occurred in the ninth embodiment of the present invention.
Figure 20:
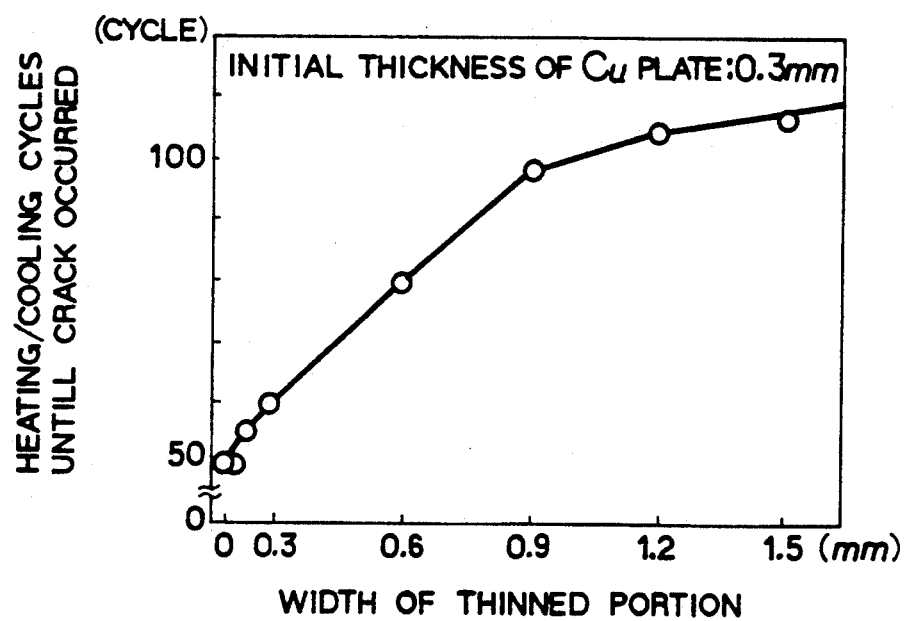
FIG. 20 is a graph showing a relationship between the width of a thinned portion and the number of heat cycles until a crack occurred in the ninth embodiment of the present invention.

FIG. 17 is a side view partially in section showing a construction of the ninth embodiment of the present invention; FIG. 18 is a plan view of FIG. 17; and FIGS. 19 and 20 are graphs showing characteristics of the ceramic circuit board according to the ninth embodiment of the present invention, respectively.

As shown in FIGS. 17 and 18, copper circuit plates 312 were bonded onto one surface of a ceramic base board 311 composed of aluminum nitride (A1N) through a bonding layer 313 by employing the active metal brazing method. At the same time, an auxiliary backing copper plate 303 for preventing thermal deformation was bonded onto the other surface side of the ceramic base board 311 through a bonding layer 313 by employing the same brazing method.

That is, a powder mixture material composed of 3 wt. % of Ti, 37 wt. % of Ag and 65 wt. % of Cu was added to a binder such as organic compound or the like and solvent. Then, the mixture was well mixed to prepare a paste, and a pattern was printed onto the ceramic base board 311. Subsequently, the copper circuit plate 312 was arranged onto the upper surface of the ceramic base board 311 in along with the pattern formed thereon. In this state, the ceramic base board 311 and the copper circuit plate 312 were heated in Ar gas atmosphere to thereby be integrally bonded to each other through a bonding layer. The backing copper plate 313 was also bonded onto the other surface side of the ceramic base board 311 in the same manner.

The copper circuit plate 312 to be used in the ceramic circuit board according to this embodiment was previously prepared in such a manner that an etching treatment was effected onto an entire edge portion, i.e., an upper peripheral portion of a raw material copper plate having a thickness of 0.3 mm. The upper peripheral portion to be etched is on the upper surface opposing the bonding surface side of the material copper plate whereby, a step potion 314 was formed on the peripheral portion of the material copper plate, so that a thinned portion 315 having a lower thickness than that of main central portion of the material copper plate was obtained.

Then, various ceramic circuit boards of this embodiment were manufactured by varying the thickness B of the thinned portion 315 within a range of ⅓ to 1/1 of the thickness of the raw copper material plate.

With respect to each of the thus formed ceramic circuit boards, a thermal shock cycle test (TCT) was conducted. FIG. 19 is a graph showing a state of occurrence of micro-cracks in the ceramic base board after the TCT was conducted. In FIG. 19, the vertical axis represents a number of heating/cooling cycles (temperature cycles) until the crack occurred, and the horizontal axis represents a thickness B of the thinned portion 315.

The conditions of the TCT were as follows. That is, one heating/cooling cycle comprises the steps of: heating the ceramic circuit board up to a temperature of 40° C. and retaining the state for 30 minutes; cooling the board to RT (room temperature) of about 25° C. and retaining the state for 15 minutes; heating again the board up to a temperature of 125° C. and retaining the state for 30 minutes; and cooling again the board to the RT and retaining the state for 15 minutes.

A detection of a crack was conducted in accordance with a method comprising the steps of: melting the copper circuit plate 312 and removing it away from the ceramic base board 311; submerging the ceramic base board 311 into a red ink; and observing the red ink which bleeds from the crack by means of a microscope or with the naked eye.

The heating/cooling cycle was repeated with respect to the ceramic circuit boards, and presence or absence of a crack was checked out or detected at every five heating/cooling cycles. The number of the heating/cooling cycles until the occurrence of the crack was plotted onto a graph. The results are shown in FIG. 19.

As is clear from FIG. 19, it is confirmed such that when the thickness B of the thinned portion 315 formed at the periphery edge portion of the copper circuit plate 312 is larger than two-thirds (⅔) of the thickness of the central portion of the copper circuit plate 312, it is not always possible to prevent the crack formation completely.

Accordingly, the thickness B of the thinned portion 315 to be formed at the peripheral edge portion of the copper circuit plate 312 may preferably be set to two-thirds (⅔) or less of the thickness A of the central portion of the copper circuit plate 312.

On the other hand, other various ceramic circuit boards of this embodiment were manufactured by varying the width C of the thinned portion 315 within a range of 0 to 5 times the thickness of the raw copper material plate.

With respect to each of the thus formed ceramic circuit boards each having a different width C of the thinned portion 315, the TCT was conducted. FIG. 20 is a graph showing a state of occurrence of micro-cracks in the ceramic base board after the TCT was conducted. In FIG. 20, the vertical axis represents a number of heating/cooling cycles until the crack occurred, and the horizontal axis represents a width C of the thinned portion 315.

The conditions of the TCT and a method of checking or detecting of a crack were the same as described hereinbefore.

The results of the TCT are shown in FIG. 20. As is clear from FIG. 20, it is confirmed such that when the width C of the thinned portion 315 formed at the peripheral edge portion of the copper circuit plate 312 is less than a half (½) of the thickness of the central portion of the copper circuit plate 312, it is not always possible to prevent the crack formation completely.

Accordingly, the width C of the thinned portion 315 to be formed at the peripheral edge portion of the copper circuit plate 312 may preferably be set to a half (½) or more of the thickness A of the central portion of the copper circuit plate 312.

Next, the tenth embodiment of the present invention will be explained with reference to the accompanying drawings.

Figure 21:
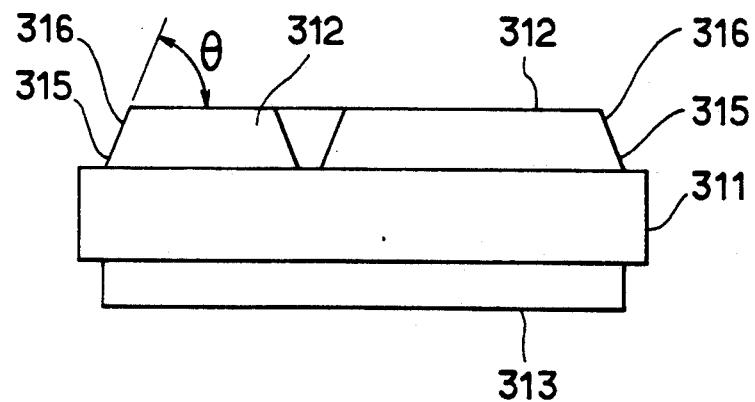
FIG. 21 is a side view showing partially in section a construction of a tenth embodiment of a ceramic circuit board according to the present invention.
Figure 22:
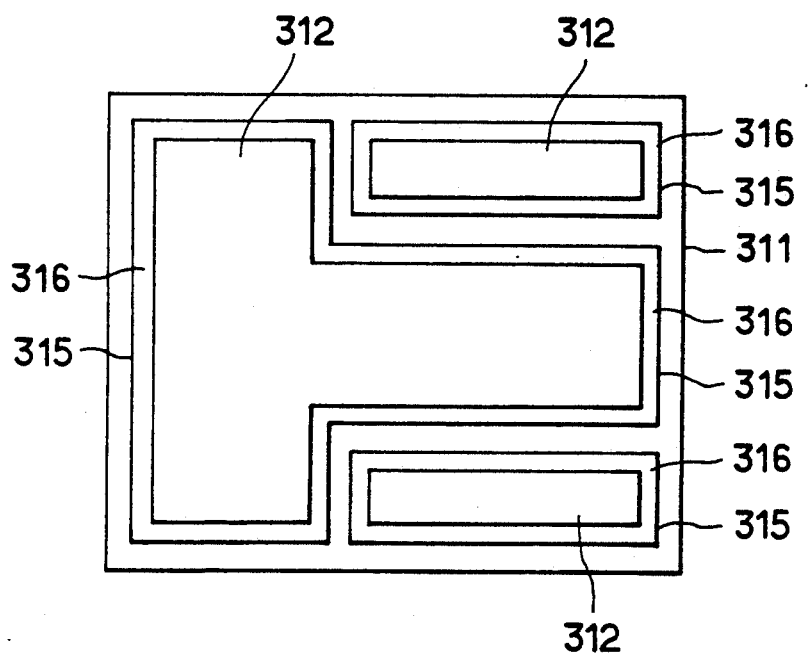
FIG. 22 is a plan view showing the tenth embodiment of the ceramic circuit board shown in FIG. 21.
Figure 23:
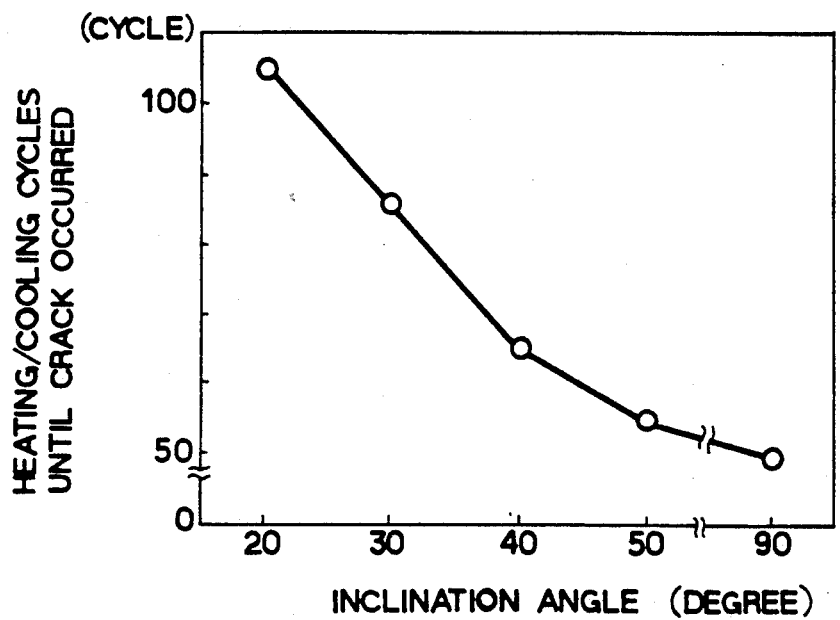
FIG. 23 is a graph showing a relationship between an inclination angle of a slant surface provided on the thinned portion and the number of heat cycles until a crack occurred in the tenth embodiment of the present invention.

Embodiment 10 (FIGS. 21 to 23)

FIG. 21 is a side view partially in section showing a construction of the tenth embodiment of the present invention; FIG. 22 is a plan view of FIG. 21; and FIG. 23 is a graph showing characteristics of the ceramic circuit board according to the tenth embodiment of the present invention.

As shown in FIGS. 21 and 22, the ceramic circuit board according to this tenth embodiment is different from that of the ninth embodiment in a point that a slant surface 316 is formed on a peripheral edge portion of the copper circuit plate 312 so as to provide a thinned portion 315 having a lower thickness than that of a main central portion of the copper circuit plate 312 in place of the step portion 314 described in the ninth embodiment.

The arrangement of elements or parts of the ceramic circuit board of the tenth embodiment shown in FIGS. 21 and 22 other than those described above are substantially the same as those of the ninth embodiment shown in FIGS. 17 and 18, so that these elements or parts are not described herein by adding the same reference numerals to the corresponding elements or parts.

On the other hand, other various ceramic circuit boards of this embodiment were manufactured by varying the inclination angle $\theta$ of the slant surface 316 formed on the thinned portion 315 within a range of 20 to 50 degrees for this embodiment, while a range of 55 to 90 degrees for Comparative Samples.

With respect to each of the thus formed ceramic circuit boards each having a different inclination angle $\theta$ respectively, the TCT was conducted. FIG. 23 is a graph showing a state of an occurrence of micro-cracks in the ceramic base board after the TCT was conducted. In FIG. 23, the vertical axis represents a number of heating/cooling cycles until the crack occurred, and the horizontal axis represents an inclination angle $\theta$ of the slant surface 316.

As is clear from the results shown in FIG. 23, it was confirmed such that when the inclination angle $\theta$ of the slant surface 316 formed at the peripheral edge portion of the copper circuit plate 312 is larger than 70 degrees, it is not always possible to prevent the crack formation completely.

On the contrary, when the inclination angle $\theta$ of the slant surface 316 provided in the copper circuit plate 312 is less than 20 degrees, there may be posed problems such that it becomes impossible to work the copper circuit plate 312 disadvantageously, and difficult to secure a sufficient plain surface area onto which a semiconductor chip is loaded.

Accordingly, it is confirmed that the inclination angle $\theta$ of the slant surface 316 to be formed at the peripheral edge portion of the copper circuit plate 312 may preferably be set to a range of 20 to 70 degrees.

By the way, though the respective embodiments were described hereinbefore with reference to the cases wherein the copper circuit plate 312 was bonded onto only one surface side of the ceramic base board 311, the present invention is not limited to those embodiments. Namely, the present invention is, as a matter of course, also applicable to a case wherein the copper circuit plates are bonded onto both surface sides of the ceramic base board.

As described above, according to the ceramic circuit board of the tenth embodiment of this invention, the peripheral edge portion is provided with a step portion or a slant surface so as to form a thinned portion having a lower thickness than that of a main central portion of the copper circuit plate, so that the thermal stress applied from the copper circuit plate onto the ceramic base board can be mitigated in comparison with a conventional one having no step portion or slant surface.

Further, it also becomes possible to mitigate a thermal stress caused by loading of the cooling/heating cycles at a state of the ceramic circuit board being assembled into a module, thus enhancing the reliability of the module.

Next, the eleventh embodiment of the present invention will now be explained with reference to the accompanying drawings of FIGS. 24 and 25.

Figure 24:
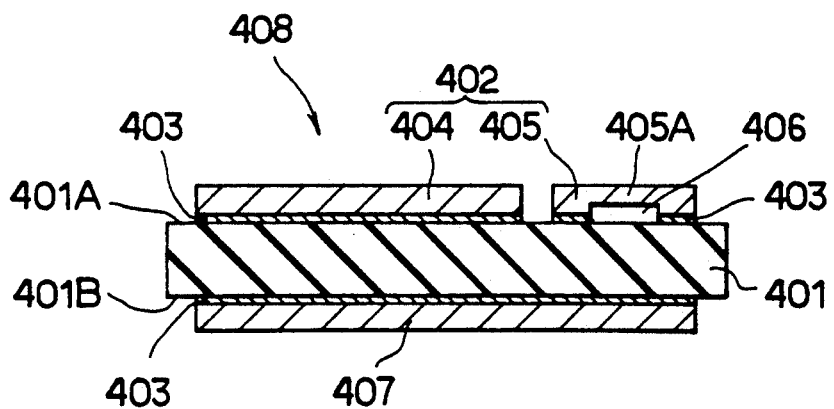
FIG. 24 is a sectional view showing a construction of an eleventh embodiment of a ceramic circuit board according to the present invention.

FIG. 24 is a sectional view showing a construction of an eleventh embodiment of the present invention. In FIG. 24, reference numeral 401 denotes a ceramic base board. A material for the ceramic base board 401 is not particularly restricted, and various types of materials may be applicable. Preferred examples of the materials may include: oxide type sintered bodies such as those composed of aluminum oxide, mullite ($3Al_2O_3\text{-}2SiO_2$) or the like; and non-oxide type sintered bodies such as those composed of aluminum nitride, silicon nitride, silicon carbide or the like. However, in a case of modules such as a power transistor module or high-frequency transistor module wherein a semiconductor chip having a high heat release value is loaded, it is preferable to use the sintered bodies such as those composed of aluminum nitride, silicon nitride, silicon carbide or the like that are all excellent in thermal conductivity.

Metal circuit plates 401 such as copper plates having predetermined circuit patterns are integrally bonded onto one main surface 401A of a ceramic circuit board 401 through a brazing material layer 403 containing an active metal (hereinafter referred to as "active metal brazing material"). As a material for the metal circuit plate 402, various kinds of metal can be used. However, it is preferable to use a copper or an alloy thereof in consideration of thermal conductivity and electrical characteristics or the like.

The active metal brazing material described above is prepared by adding an active metal into a brazing material composed of Ag-Cu type eutectic compound or Cu type compound etc. The active metal is selected from the group consisting of 4A and 5A family elements such as Ti, Zr, Hf, V, Nb and Ta listed in the periodic table.

For example, the metal circuit plate and the ceramic base board are integrally bonded by utilizing the Ag-Cu eutectic compound, or by utilizing a reaction between the active metal and the component element of the ceramic base board (e.g., a reaction between N and Ti or the like in case of AlN base board).

The metal circuit plates 402 are provided with circuit patterns by patterning to form a plurality of circuit portions 404 and 405. Among them, the circuit portion 404 is used as an area for loading a semiconductor chip, and the circuit portion 405 is used as a terminal connecting port, respectively. In this regard, on a metal plate to be used as a terminal connecting port 405, there is provided a recessed portion 406 having a predetermined depth.

The recessed portion 406 is formed at a portion corresponding to a terminal connecting position. The depth of the recessed portion may preferably be set to a range of about 1/20 to 18/20, more preferably to a range of about ¼ to ½, of a initial thickness of the metal plate. A surface side to which the recessed portion 406 is formed is used as a bonding surface, and the bonding surface except the recessed portion 406 is integrally bonded onto the ceramic base board through an active metal brazing material layer 403 to form the terminal connecting port 405.

That is, among the circuit portions of the metal circuit plate 402, the terminal connecting port 405 has a construction comprising a gap (non-bonded portion) formed between the ceramic base board 401 and the circuit portion. The gap is defined by the recessed portion 406.

The terminal connecting port 405 having the gap 406 has a function of mitigating a movement of the terminal. The terminal is connected to the connecting port 405 at a module assembling process. The function of mitigation described above is performed by the action of spring-like performance of the metal plate 405A located above the gap 406. The movement or replacement of the terminal described above causes in accordance with ON/OFF switching operations of the power source.

In addition, the terminal connecting port 405 has also a particular function of preventing temperature cycles (heating/cooling cycles) transmitted from the terminal from being directly applied onto a bonded portion (i.e., a bonded portion through the active metal brazing material layer 403) by resistance of heat transfer of the gap 406.

By the way, the other circuit portions 404 are entirely and uniformly bonded onto the ceramic base board 401 through the active metal brazing material layer 403. Further, a metal plate 407 such as a copper plate, which is used as a connecting port or heat sink, is also bonded onto another main surface side of the ceramic base board 401 through the active metal brazing material layer 403. Thus, the ceramic circuit board according to the eleventh embodiment of this invention is constructed.

The ceramic circuit board having the construction described above may be manufactured, for example, in accordance with the following steps.

First, a paste-like active metal brazing material e.g., Ag-Cu-Ti type brazing material having a composition of Ag:Cu:Ti=70.6:27.4:2.0% in weight basis is coated onto the ceramic base board 401 e.g., an aluminum nitride base board to form designed circuit patterns by utilizing a screen printing method or the like. At this time, the Ag-Cu-Ti type brazing material paste shall not be coated onto a portion corresponding to a non-bonded portion including a portion corresponding to the gap 406 of the terminal connecting port 405.

On the other hand, the copper circuit plates 402 having predetermined circuit patterns are prepared by effecting an etching treatment or press working with respect to a raw metal plate such as a copper plate. At this time, the recessed portion 406 having a predetermined shape is simultaneously formed at a portion to be a terminal connecting port 405.

In this regard, when a depth of the recessed portion 406 is excessively shallow, there cannot be provided a sufficient spring-like performance and heat diffusing effect. On the contrary, when the depth of the recessed portion 406 is excessively deep, it becomes impossible to secure a sufficient current capacity.

Therefore, as stated above, the depth of the recessed portion, though it varies depending on an initial thickness of the raw metal plate, may preferably be set to a range of about 1/20 to 18/20, more preferably to a range of about ¼ to ½ of the initial thickness of the raw metal plate.

Subsequently, the thus formed copper circuit plates 402 are arranged on an upper surface of the aluminum nitride base board 401 on which the Ag-Cu-Ti type brazing material paste is coated. At the same time, a backing copper plate 407 is also arranged onto a back surface side of the aluminum nitride base board 401 to form an assembled body. Then, the assembled body is heated up to a temperature of about 850° C. under a vacuumed condition of about $1 \times 10^{-4}$ Torr, and is retained at the temperature for about 10 minutes whereby the copper circuit plate 402 and the backing copper plate 407 are integrally bonded onto the aluminum nitride base board 401, thus providing a desired ceramic circuit board 408.

By the way, as a method of forming the pattern, it is also possible to adopt a method comprising the steps of: coating the Ag-Cu-Ti type brazing material paste onto a surface of a copper plate except a portion corresponding to the gap 406 of the terminal connecting port 405; arranging the copper plate having the recessed portion 406 onto the ceramic base board and thermally bonding both the copper plate and the ceramic base board to each other; and thereafter effecting an etching treatment to form the pattern.

In addition, the Ag-Cu-Ti type brazing material is not restricted to those in the form of a paste. A brazing material in the form of a foil may also be interposed between the copper plate and the ceramic base board.

Next, a power transistor module into which the ceramic circuit board (aluminum nitride circuit board) described above is assembled, will now be explained with reference to FIG. 25.

Figure 25:
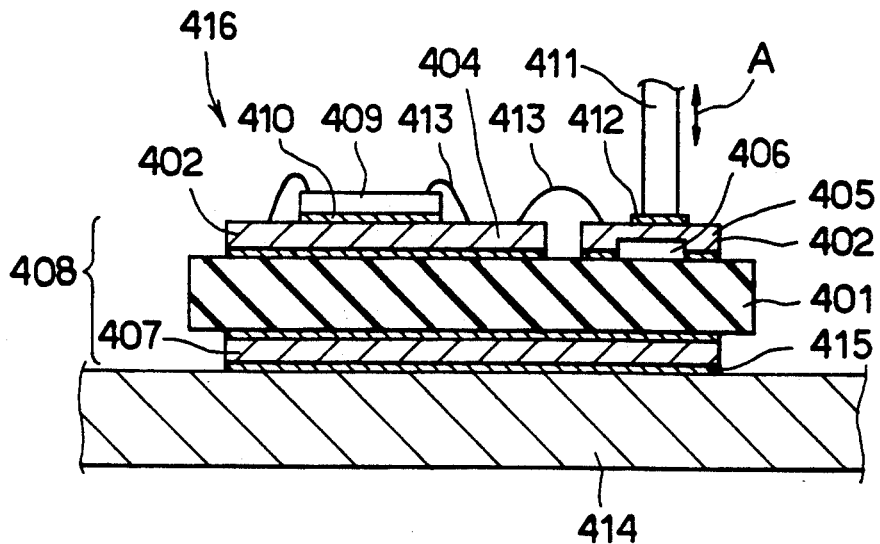
FIG. 25 is a partial sectional view showing a power transistor module into which the ceramic circuit board shown in FIG. 24 is adopted.

FIG. 25 is a partial sectional view showing an essential part of the power transistor module according to this embodiment. A power transistor 409 is bonded and loaded onto a semiconductor chip loading port 404 of the aluminum nitride circuit board 408 through an Au solder 410 or the like. Further, a terminal 411 connected to a power source circuit or the like is bonded onto a terminal connecting port 405 of a copper circuit plate 402, the terminal connecting port is directed to an upper position of the gap 406. The semiconductor chip loading port 404 and the terminal connecting port 405 are electrically connected to each other by means of an Al wire 413. Similarly, the power transistor 409 and a circuit of the semiconductor chip loading port 404 are electrically connected to each other by means of another Al wire 413, respectively.

As described above, the power transistor 409 is loaded and fixed onto the aluminum nitride circuit board 408. The terminal 411 is also connected to AlN circuit board 408 through the solder 412. Then, the fabricated AlN circuit board 408 is bonded by a solder (solder layer 415) onto a heat sink 414 through a backing copper plate 407 which is provided on a back surface side of the aluminum nitride base board 401. As a result, an essential part of the power transistor module is constructed.

In the power transistor module 416 described above, the terminal connecting port 405 constituting a part of the circuit portions of the copper circuit plate 402 has a construction having the gap 406 between the aluminum nitride base board 401 and the terminal connecting port 405 of itself.

Therefore, even in a case when the terminal 411 is moved or vibrated, as indicated by an arrow A in FIG. 25, in accordance with ON/OFF switching operations in a circuit of the power source, a mechanical stress caused by the movement of the terminal 411 can be mitigated by the action of a spring-like performance of the metal plate 405A formed above the gap 406.

Further, even in a case where the temperature cycles caused in accordance with the ON/OFF switching operations are applied onto the copper circuit plate 402, it is possible to prevent a heat due to the temperature cycles from being applied directly to the bonded portion between the copper circuit plate 402 and the aluminum nitride base board 401 by the action of a high-thermal resistance of the gap 406. Thereby, the reliability of the terminal connecting port 405 is remarkably increased, thus providing various types of modules having an excellent reliability.

Furthermore, samples of the power transistor module comprising the aluminum nitride base board 401 and the copper circuit plate 402 having a thickness of 0.3 mm and a depth of the recessed portion of 0.15 mm were practically manufactured.

Then, with respect to each of the thus formed power transistor modules, the ON/OFF switching operation was repeatedly effected for 10000 cycles. Thereafter, the respective bonded surface between the terminal connecting port 405 and the aluminum nitride base board 401 was observed. As a result, defects such as cracks were not observed at all. In addition, the respective bonded portion was observed to be retained in a sound condition.

On the contrary, in a case of the power transistor modules of Comparative Samples that were manufactured in the same manner as in Samples of the eleventh embodiment according to this invention except that the terminal connecting port 405 having no recessed portion was uniformly bonded onto the surface of the aluminum nitride base board, cracks occurred in the aluminum nitride base board 401 after the ON/OFF operation was repeated for 5000 cycles. In addition, when the ON/OFF operation was repeated for 10000 cycles, the copper circuit plate (terminal connecting port 405) was peeled off from the aluminum nitride base board 401, thus resulting in a remarkable increase of thermal resistance.

Next, a twelfth embodiment of the present invention will now be explained with reference to the accompanying drawings of FIG. 26.

Figure 26:
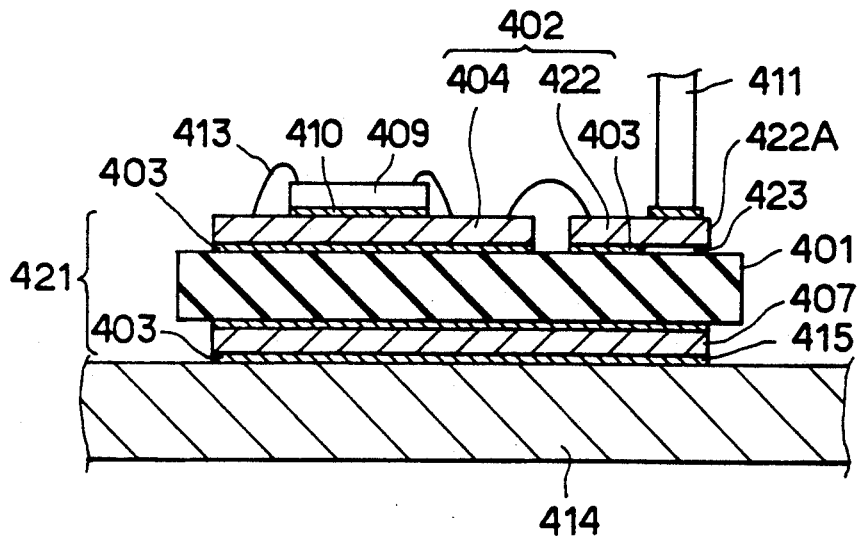
FIG. 26 is a sectional view showing a power transistor module into which a twelfth embodiment of a ceramic circuit board according to the present invention is adopted.
Figure 27:
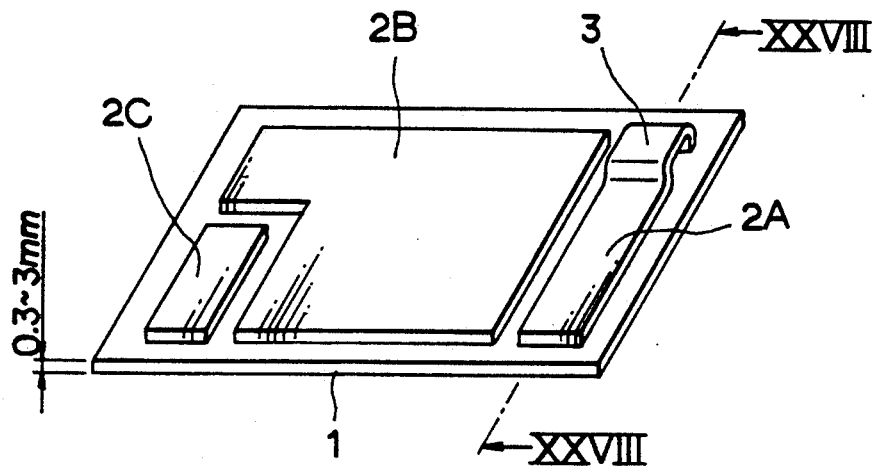
FIG. 27 is a perspective view showing a construction of a conventional ceramic circuit board manufactured by employing a DBC method.
Figure 28:
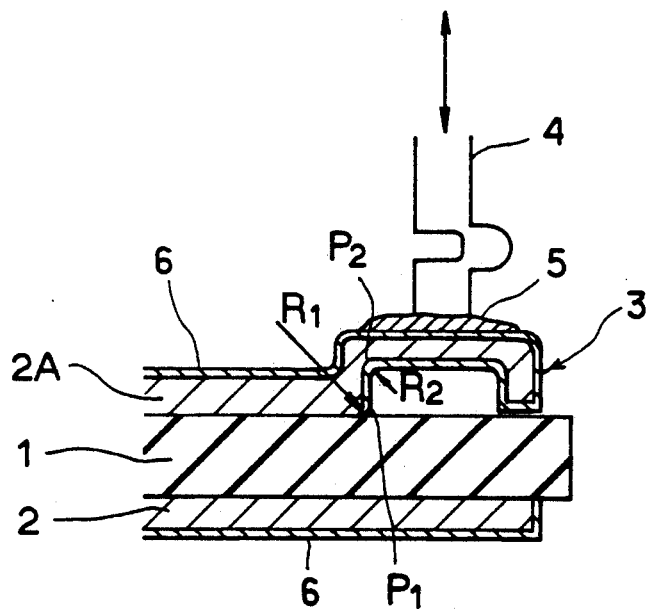
FIG. 28 is a partial sectional view taken along the line XXIII-XXIII in FIG. 27.

FIG. 26 is a partial sectional view showing an essential part of a power transistor module into which the ceramic circuit board 421 of the embodiment described above is assembled in the same manner as that of the eleventh embodiment.

The ceramic circuit board 421 used in the twelfth embodiment is provided with a non-bonded portion (gap 423). The non-bonded portion is formed in such a manner that an active metal brazing material layer 403 is not coated onto an area ranging from a side edge portion 422A of the terminal connecting port 422 of the metal circuit plate 402 to an edge portion of a terminal connecting area.

Namely, the terminal connecting port 422 has a construction having the gap 423 which is formed by providing a non-coated portion of the active metal brazing material between the ceramic base board 401 and the terminal connecting port 422.

As stated above, the non-bonded portion i.e., the gap 423 ranges from the side edge portion 422A of the terminal connecting port 422 to the edge portion of a terminal connecting area, so that the metal plate located above the gap 406 may show a spring-like performance or function. Therefore, as is the same manner described in the eleventh embodiment, it is possible to mitigate the mechanical stress caused by the movement of the terminal, which is connected to the terminal connecting port 422.

Further, it is also possible to mitigate the temperature cycles applied from the terminal 411 in accordance with the ON/OFF switching operations in the circuit of the power source. Thereby, it becomes possible to remarkably increase the reliability of the ceramic circuit board 421 together with the power transistor module or the like.

As described above, according to the eleventh and twelfth embodiments of the present invention, even in a case where the mechanical stresses caused by the heat cycles in accordance with ON/OFF switching operations of the power source or caused by the movement of the terminal, are applied onto the ceramic circuit board for a long period of time, it is possible to secure a sufficient bonding reliability of the metal circuit plate. Therefore, it becomes possible to provide various type of modules having an excellent reliability.

What is claimed is:

1. A ceramic circuit board comprising:
   a ceramic base board;
   a metal circuit plate integrally bonded onto a surface of the ceramic base board; and
   a terminal connecting port formed by bending a part of the metal circuit plate for connecting a terminal of a module, the terminal connecting port being formed so that the terminal connecting port is raised from the surface of the ceramic base board, and a radius of curvature of the bent portion provided on the terminal connecting port is set to 0.2 mm or more.

2. A ceramic circuit board according to claim 1, wherein the ceramic base board and the metal circuit plate are directly bonded by a eutectic phase to each other.

3. A ceramic circuit board according to claim 1, wherein the ceramic base board and the metal circuit plate are bonded to each other through a bonding layer containing an active metal selected from the group consisting of Ti, Zr, Hf, V, Nb and Ta.

4. A ceramic circuit board according to claim 1, wherein the terminal connecting port is formed in a shape of a cantilever.

5. A ceramic circuit board according to claim 1, wherein the metal circuit plate is composed of copper.

6. A ceramic circuit board comprising:
   a ceramic base board;
   a metal circuit plate integrally bonded onto a surface of the ceramic base board through a bonding layer containing an active metal selected from the group consisting of Ti, Zr, Hf, V, Nb and Ta; and
   a semiconductor chip bonded onto a surface of the metal circuit plate, the metal circuit plate being provided with an empty communication hole at a bonding surface between the metal circuit plate and the ceramic base board so as to communicate the bonding surface with an outside of the ceramic base board through the empty communication hole.

7. A ceramic circuit board according to claim 6, wherein the empty communication hole is a through hole formed so as to pass through the metal circuit plate in a direction perpendicular to a plane of the metal circuit plate.

8. A ceramic circuit board comprising:
   a ceramic base board;
   a metal circuit plate integrally bonded onto one surface of the ceramic base board through a first bonding layer containing an active metal selected from the group consisting of Ti, Zr, Hf, V, Nb and Ta;
   a backing metal plate for preventing thermal deformation of the ceramic base board, which is integrally bonded onto another surface of the ceramic base board through a second bonding layer containing an active metal;
   a semiconductor chip bonded onto a surface of the metal circuit plate through a first solder layer; and
   a heat sink for releasing heat, which is bonded onto a surface of the backing copper plate through a second solder layer, the metal circuit plate and the backing metal plate being provided with an empty communication hole respectively formed at each of bonding surfaces so as to communicate the each of the bonding surfaces with an outside of the ceramic base board through the empty communication hole.

9. A ceramic circuit board according to claim 8, wherein the empty communication hole is a plurality of through holes respectively formed so as to pass through the metal circuit plate and the backing metal plate in a direction perpendicular to planes of the metal circuit plate and the backing metal plate.

10. A ceramic circuit board comprising:
    a ceramic base board;
    a metal circuit plate integrally bonded onto a surface of the ceramic base board through a bonding layer containing an active metal selected from the group consisting of Ti, Zr, Hf, V, Nb and Ta; and
    a semiconductor chip bonded onto a surface of the metal circuit plate through a solder layer, the metal circuit plate being provided with a groove at a bonding surface directing to the semiconductor chip so as to communicate the bonding surface with an outside of the semiconductor chip through the groove.

11. A ceramic circuit board comprising:
    a ceramic base board;
    a metal circuit plate integrally bonded onto one surface of the ceramic base board through a first bonding layer containing an active metal selected from the group consisting of Ti, Zr, Hf, V, Nb and Ta;
    a backing metal plate for preventing thermal deformation, which is integrally bonded onto another surface of the ceramic base board through a second bonding layer containing an active metal;
    a semiconductor chip bonded onto a surface of the metal circuit plate through a first solder layer; and
    a heat sink for releasing heat, which is bonded onto a surface of the backing metal plate through a second solder layer, the metal circuit plate and the backing metal plate being provided respectively with a groove formed at each of solder layer side surfaces so as to communicate the each of the solder layer side surfaces with an outside of the semiconductor chip through the groove.

* * * * *

UNITED STATES PATENT AND TRADEMARK OFFICE
CERTIFICATE OF CORRECTION

PATENT NO. : 5,328,751
DATED : July 12, 1994
INVENTOR(S) : HIROSHI KOMORITA ET AL It is certified that error appears in the above-indentified patent and that said Letters Patent is hereby corrected as shown below:

On the title page, item [54] and column 1, the title should read --CERAMIC CIRCUIT BOARD--.

Signed and Sealed this

Third Day of January, 1995

Attest:

BRUCE LEHMAN

Attesting Officer

Commissioner of Patents and Trademarks